US012745532B2

(12) United States Patent
Liu et al.

(10) Patent No.: US 12,745,532 B2
(45) Date of Patent: Sep. 22, 2026

(54) DISPLAY SUBSTRATE AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Xiaonan Liu, Beijing (CN); Jun Li, Beijing (CN); Changsoon Ji, Beijing (CN); Tinghua Shang, Beijing (CN); Qian Xu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 373 days.

(21) Appl. No.: 18/279,048

(22) PCT Filed: Aug. 24, 2022

(86) PCT No.: PCT/CN2022/114390
§ 371 (c)(1),
(2) Date: Aug. 25, 2023

(87) PCT Pub. No.: WO2023/030110
PCT Pub. Date: Mar. 9, 2023

(65) Prior Publication Data

US 2024/0138222 A1 Apr. 25, 2024
US 2024/0237458 A9 Jul. 11, 2024

(30) Foreign Application Priority Data

Aug. 31, 2021 (CN) ......................... 202111014705.5

(51) Int. Cl.
*H10K 59/35* (2023.01)
*H10K 59/122* (2023.01)
*H10K 59/80* (2023.01)

(52) U.S. Cl.
CPC ......... *H10K 59/353* (2023.02); *H10K 59/122* (2023.02); *H10K 59/8723* (2023.02)

(58) Field of Classification Search
CPC ............... H10K 59/353; H10K 59/122; H10K 59/8723; H10K 59/12; H10K 59/352
See application file for complete search history.

(56) References Cited

U.S. PATENT DOCUMENTS 10,923,543 B1 2/2021 Chen
2016/0181343 A1 6/2016 Wang et al.
(Continued)

FOREIGN PATENT DOCUMENTS

CN 104124263 A 10/2014
CN 104282717 A 1/2015
(Continued)

OTHER PUBLICATIONS

Wang et al., CN111799320,machine translation, Sep. 2020 (Year: 2020).*
(Continued)

*Primary Examiner* — Tracie Y Green
(74) *Attorney, Agent, or Firm* — HOUTTEMAN LAW LLC

(57) ABSTRACT

The present disclosure provides a display substrate and a display apparatus, belongs to the field of display technology, and at least partially solves one existing technical problem. The display substrate includes a base substrate, and sub-pixels in an array at intervals on the base substrate; wherein the adjacent sub-pixels are provided with a spacer region therebetween; the spacer region includes a first spacer region
(Continued)

having a functional position, and a second spacer region having no functional position; at least some functional positions are provided with functional parts; and a width of the first spacer region between two adjacent sub-pixels arranged along the first direction or the second direction is greater than that of the second spacer region between two adjacent sub-pixels arranged along the same direction; wherein a width of the spacer region is equal to a shortest distance between boundaries of the two sub-pixels corresponding to the spacer region.

19 Claims, 10 Drawing Sheets

(56) References Cited

U.S. PATENT DOCUMENTS

| | | | | |
|---|---|---|---|---|
| 2016/0225834 | A1 | 8/2016 | Kim et al. | |
| 2019/0252469 | A1 | 8/2019 | Xiao et al. | |
| 2021/0005686 | A1* | 1/2021 | Cheng | H10K 59/122 |
| 2024/0179968 | A1* | 5/2024 | Yuan | G09G 3/3233 |

FOREIGN PATENT DOCUMENTS

| | | | | | |
|---|---|---|---|---|---|
| CN | 105047683 | A | | 11/2015 | |
| CN | 105845706 | A | | 8/2016 | |
| CN | 108010934 | A | | 5/2018 | |
| CN | 109728061 | A | | 5/2019 | |
| CN | 110133919 | A | | 8/2019 | |
| CN | 111554712 | A | | 8/2020 | |
| CN | 111799320 | A | | 10/2020 | |
| CN | 112038375 | A | | 12/2020 | |
| CN | 112313802 | A | | 2/2021 | |
| CN | 112750863 | A | | 5/2021 | |
| CN | 113053973 | A | * | 6/2021 | H10K 59/353 |
| CN | 113257882 | A | | 8/2021 | |
| CN | 216213464 | U | | 4/2022 | |
| JP | 2005258176 | A | | 9/2005 | |
| JP | 2014099402 | A | | 5/2014 | |
| JP | 2021039342 | A | | 3/2021 | |
| JP | 2021513094 | A | | 5/2021 | |
| WO | WO2012143817 | A2 | | 10/2012 | |
| WO | WO2018086370 | A1 | | 5/2018 | |

OTHER PUBLICATIONS

Hu et al.CN108010934A foreign and machine translation (Year: 2018).*

Cn_113053973 machine translation (Year: 2021).*

China Patent Office, First Office Action, May 1, 2025, for corresponding CN application No. 202111014705.5.

Japan Patent Office, First Office Action, Aug. 4, 2026, for corresponding JP application No. 2023-551780.

* cited by examiner

Display substrate

Display apparatus

DISPLAY SUBSTRATE AND DISPLAY APPARATUS

TECHNICAL FIELD

The present disclosure relates to the field of display technology, and in particular to a display substrate and a display apparatus.

BACKGROUND

An organic light emitting diode (OLED) display is an important display mode. Compared with a liquid crystal display (LCD), the OLED display has the advantages of low energy consumption, low cost, self-luminescence, wide viewing angle, fast response speed, and the like, and thus is widely applied to the fields of mobile phones, tablet computers, digital cameras, and the like.

An OLED display substrate mainly includes a base substrate, and a plurality of sub-pixels (or pixel units) arranged in an array (e.g., a matrix) on the base substrate; each sub-pixel includes an OLED device. The OLED device is formed through an evaporation process, that is, a structure such as a light emitting layer (EML) of the OLED device is formed by controlling an organic material to pass through an opening in a fine metal mask (FMM).

SUMMARY

The present disclosure at least partially solves one of the technical problems in the prior art, and provides a display substrate and a display apparatus.

In a first aspect, an embodiment of the present disclosure provides a display substrate, including a base substrate, and a plurality of sub-pixels in an array at intervals on the base substrate; wherein the adjacent sub-pixels are provided with a spacer region therebetween; the spacer region includes a first spacer region having a functional position, and a second spacer region having no functional position; functional parts are arranged at at least some functional positions; and a width of the first spacer region between two adjacent sub-pixels arranged along the first direction or the second direction is greater than that of the second spacer region between two adjacent sub-pixels arranged along the same direction; wherein a width of the spacer region is equal to a shortest distance between boundaries of the two sub-pixels corresponding to the spacer region.

In some embodiments, the width of the first spacer region is greater than or equal to 20 μm.

In some embodiments, a distance between a boundary of each functional part and a boundary of a corresponding sub-pixel closest to the functional part is greater than or equal to 3 μm.

In some embodiments, the width of the second spacer region is less than or equal to 19 μm.

In some embodiments, a shortest connecting line between boundaries of two sub-pixels corresponding to at least a first spacer region passes through the functional part in the first spacer region.

In some embodiments, in a cross-section passing through the shortest connecting line and perpendicular to the base substrate, a distance between the boundaries of the two sub-pixels corresponding to the first spacer region is greater than or equal to 20 μm, and a distance between the functional part in the first spacer region and each of the sub-pixels is greater than or equal to 3 μm.

In some embodiments, a connecting line between geometric centers of two sub-pixels corresponding to at least a first spacer region passes through the functional part in the first spacer region.

In some embodiments, the connecting line between the geometric centers of the two sub-pixels corresponding to at least the first spacer region passes through a geometric center of the functional part in the first spacer region.

In some embodiments, at least some first spacer regions extend in a third direction; at least some first spacer regions extend in a fourth direction; the fourth direction intersects the third direction; and the at least some first spacer regions extending in the third direction and the at least some first spacer regions extending in the fourth direction have an overlapping region therebetween, and at least some functional parts at least partially overlap the overlapping region.

In some embodiments, a distance between adjacent functional parts is between 100 μm and 300 μm.

In some embodiments, the number of the functional positions with the functional parts is at least 15% of the total number of the functional parts.

In some embodiments, the display substrate further includes a pixel definition layer; the pixel definition layer includes pixel definition layer openings, and pixel definition parts between the pixel definition layer openings; the pixel definition layer openings define light emitting regions of the plurality of sub-pixels; and the functional parts are on a side of the pixel definition parts away from the base substrate.

In some embodiments, the functional parts and the pixel definition parts have a one-piece structure.

In some embodiments, in the plurality of sub-pixels adjacent to at least some functional parts, at least one sub-pixel has a geometric center offset from a straight line extending along the first direction, and at least two sub-pixels in the same row as the at least one sub-pixel in the first direction have geometric centers on the straight line; and/or in the plurality of sub-pixels adjacent to the at least some functional parts, at least one sub-pixel has a geometric center offset from a straight line extending along the second direction, and at least two sub-pixels in the same row as the at least one sub-pixel in the second direction have geometric centers on the straight line; the second direction intersects the first direction.

In some embodiments, the plurality of sub-pixels include first sub-pixels, second sub-pixels, and third sub-pixels; the first sub-pixels and the third sub-pixels are alternately arranged along the first direction to form first pixel groups, and are alternately arranged along the second direction to form third pixel groups; the second direction intersects the first direction; the second sub-pixels are arranged along the first direction to form second pixel groups, and arranged along the second direction to form fourth pixel groups; and wherein the first pixel groups and the second pixel groups are alternately arranged along the second direction; the third pixel groups and the fourth pixel groups are alternately arranged along the first direction.

In some embodiments, in the spacer regions each between the first sub-pixel and the third sub-pixel adjacent to each other in each third pixel group, at least some spacer regions are the first spacer regions; and the spacer regions each between the first sub-pixel and the third sub-pixel adjacent to each other in each first pixel group are the second spacer regions.

In some embodiments, the spacer regions each between the first sub-pixel and the third sub-pixel adjacent to each other in each third pixel group are alternately arranged along the second direction as the first spacer regions and the second spacer regions; and one of the first spacer regions in one of two adjacent third pixel groups and one of the second spacer regions in the other one of the two adjacent third pixel groups are between two rows of sub-pixels in the first direction.

In some embodiments, lines sequentially connecting geometric centers of two first sub-pixels and two third sub-pixels in an array form a virtual trapezoid; and a spacer region between the first sub-pixel and the third sub-pixel corresponding to a bottom side of the virtual trapezoid is the first spacer region, and a spacer region between the first sub-pixel and the third sub-pixel corresponding to a top side of the virtual trapezoid is the second spacer region.

In some embodiments, the bottom side of the virtual trapezoid is parallel to the second direction.

In some embodiments, the virtual trapezoid is a virtual isosceles trapezoid.

In some embodiments, in each of at least one first spacer region between the first sub-pixels and the third sub-pixels adjacent to each other, a geometric center of the functional part is on a connecting line between a geometric center of the first sub-pixel and a geometric center of the third sub-pixel corresponding to the first spacer region.

In some embodiments, in each of at least one first spacer region between the first sub-pixels and the third sub-pixels adjacent to each other, along the second direction, a distance between a geometric center of the functional part and a geometric center of the first sub-pixel corresponding to the first spacer region is smaller than a distance between a geometric center of the functional position and a geometric center of the third sub-pixel corresponding to the first spacer region.

In some embodiments, in each of at least one first spacer region between the first sub-pixels and the third sub-pixels adjacent to each other, along the second direction, the geometric center of the functional part is on a side of a reference line corresponding to the functional part close to the first sub-pixel corresponding to the first spacer region; wherein the reference line of the functional position is a connecting line between geometric centers of the two second sub-pixels on two sides of the functional position in the first direction.

In some embodiments, a shape of the first sub-pixel includes a square or a rounded square, including one diagonal parallel to the first direction and the other diagonal parallel to the second direction; and a shape of the third sub-pixel includes a square or a rounded square, including one diagonal parallel to the first direction and the other diagonal parallel to the second direction.

In some embodiments, at least a third sub-pixel is divided into asymmetric first and second portions by a line passing through a geometric center of the third sub-pixel and parallel to the first direction; and a maximum dimension of the first portion is smaller than that of the second portion along the second direction; and in the first spacer regions each between the first sub-pixel and the third sub-pixel adjacent to each other in the second direction, at least a first spacer region is a spacer region between the first portion of the third sub-pixel and the first sub-pixel adjacent to the third sub-pixel.

In some embodiments, the plurality of sub-pixels include first sub-pixels, second sub-pixels, third sub-pixels; first sub-pixel pairs and the third sub-pixels are alternately arranged along the first direction to form a fifth pixel group; each first sub-pixel pair includes one first sub-pixel and one second sub-pixel in the second direction; the second direction intersects the first direction; the first sub-pixels and the second sub-pixels are alternately arranged along the second direction to form a sixth pixel group; the third sub-pixels are arranged along the second direction to form a seventh pixel group; and wherein a plurality of the sixth pixel groups and a plurality of the seventh pixel groups are alternately arranged along the first direction; a plurality of the fifth pixel groups are arranged along the second direction.

In some embodiments, in the spacer regions each between the adjacent third sub-pixels in the seventh pixel group, at least some spacer regions are the first spacer regions; the spacer regions each between the first sub-pixel and the third sub-pixel adjacent to each other in the fifth pixel group, and the spacer regions each between the second sub-pixel and the third sub-pixel adjacent to each other in the fifth pixel group are the second spacer regions; and the spacer regions each between the first sub-pixel and the second sub-pixel adjacent to each other in the fifth pixel group are the second spacer regions.

In some embodiments, the spacer regions between the adjacent third sub-pixels in at least a seventh pixel group are alternately arranged along the second direction as the first spacer regions and the second spacer regions.

In some embodiments, at least a third sub-pixel is divided into asymmetric first and second portions by a line passing through a geometric center of the third sub-pixel and parallel to the first direction; and a maximum dimension of the first portion is smaller than that of the second portion along the second direction; and in the first spacer regions each between the third sub-pixels adjacent to each other in the second direction, at least a first spacer region is a spacer region between the first portions of the third sub-pixels.

In some embodiments, the plurality of sub-pixels include first sub-pixels, second sub-pixels, third sub-pixels; second sub-pixel pairs, the first sub-pixels and the third sub-pixels are alternately arranged along the first direction to form an eighth pixel group; each second sub-pixel pair includes two second sub-pixels along the second direction; the second direction intersects the first direction; a plurality of the eighth pixel groups are arranged along the second direction; and one second sub-pixel pair of one of two adjacent eighth pixel groups is between one first sub-pixel and one third sub-pixel of the other one of the eighth pixel groups along the first direction.

In some embodiments, at least some spacer regions each between the two adjacent eighth pixel groups and between the first sub-pixel and the third sub-pixel adjacent to each other are the first spacer regions.

In some embodiments, at least some spacer regions each between the two adjacent eighth pixel groups and between the first sub-pixel and the second sub-pixel adjacent to each other are the first spacer regions.

In some embodiments, two second sub-pixels in each second sub-pixel pair are symmetrically distributed with respect to a line parallel to the first direction.

In some embodiments, the first sub-pixels are red sub-pixels, the second sub-pixels are green sub-pixels, and the third sub-pixels are blue sub-pixels.

In some embodiments, the functional position includes a post spacer position, and the functional parts include post spacers.

In a second aspect, an embodiment of the present disclosure further provides a display apparatus, which includes the display substrate in any one of the above embodiments.

DETAIL DESCRIPTION OF EMBODIMENTS

Figure 1:
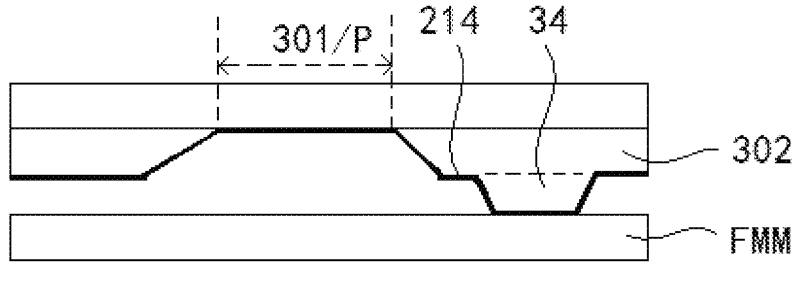
FIG. 1 is a schematic cross-sectional view of a structure of a display substrate with a supported fine metal mask during deposition in the related art.

In order to enable one of ordinary skill in the art to better understand the technical solutions of the present disclosure, the present disclosure will be described in further detail with reference to the accompanying drawings and the detailed description.

It is to be understood that the specific embodiments and drawings described herein are merely illustrative of the present disclosure and are not to be considered as limiting the present disclosure.

It is to be understood that the various embodiments of the present disclosure and the various features of the embodiments may be combined with each other without conflict.

It is to be understood that for convenience of description, only portions related to embodiments of the present disclosure are shown in the drawings of the present disclosure, and portions not related to embodiments of the present disclosure are not shown in the drawings.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Before describing a solution of an embodiment of the present disclosure in detail, some concepts involved therein are exemplified below.

In the embodiment of the present disclosure, a display substrate refers to a plate-shaped structure with a display structure used in a display apparatus, and more specifically, refers to an array substrate having a thin film transistor array, and further refers to an array substrate of an organic light emitting diode (OLED) display.

In the embodiment of the present disclosure, the display substrate includes a base substrate (or called a substrate, a base), which is a base for bearing other display structures in the display substrate, that is, the other display structures of the display substrate are "disposed" on the base substrate. The base substrate may be rigid, such as a rigid material including glass; alternatively, the base substrate may be flexible, such as a flexible material including a polymer, and thus may be used in a bendable display apparatus (e.g., a flexible display apparatus, a folding display apparatus, etc.).

In the embodiment of the present disclosure, each "sub-pixel" (or "pixel unit") refers to a minimum structure that may be independently controlled to emit light with a desired brightness. Specifically, the sub-pixel may be an organic light emitting diode (OLED) device. The organic light emitting diode device is a device composed of a cathode, a light emitting layer, and an anode which are stacked, and the light emitting layer may emit light of different brightness according to a magnitude of current flowing therethrough. The light emitting layer may specifically include a plurality of stacked sub-layers such as a hole injection layer (HIL), a hole transport layer (HTL), an organic light emitting layer (EML), an electron transport layer (ETL), and an electron injection layer (EIL).

In the embodiment of the present disclosure, a first sub-pixel, a second sub-pixel, and a third sub-pixel represent three sub-pixels with different colors, that is, three sub-pixels capable of emitting light with different colors. The three colors of the first sub-pixel, the second sub-pixel and the third sub-pixel may be "three primary colors combined together", and further, the first sub-pixel, the second sub-pixel and the third sub-pixel may be a red sub-pixel, a green sub-pixel and a blue sub-pixel. In a part of the embodiment of the present disclosure, as an example, the first sub-pixel is the red sub-pixel, the second sub-pixel is the green sub-pixel, and the third sub-pixel is the blue sub-pixel for illustration. However, it should be understood that the first sub-pixel is the red sub-pixel, the second sub-pixel is the green sub-pixel, and the third sub-pixel is the blue sub-pixel, which does not limit the scope of the embodiment of the present disclosure. Different types of sub-pixels emit light with different colors in various manners. For example, materials of light emitting layers of organic light emitting diode devices of different types of sub-pixels may be different from each other, or color filters (CF) with different colors are disposed at the different types of sub-pixels, and so on, which will not be described in detail herein.

Figure 3:
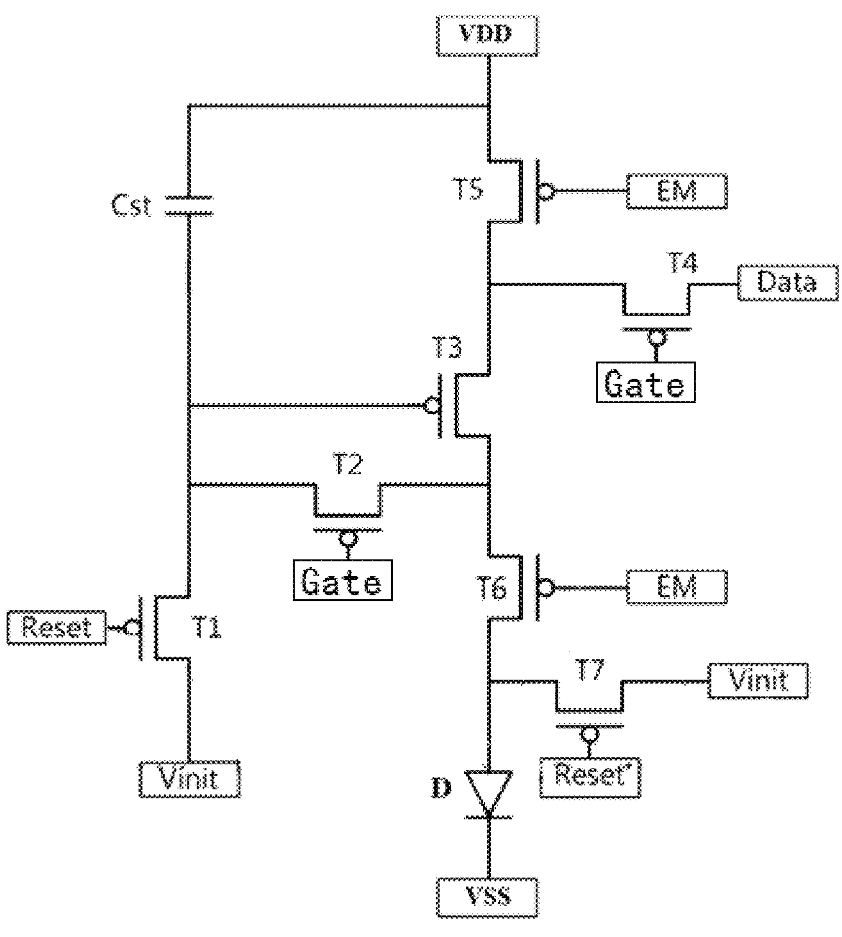
FIG. 3 is a circuit diagram of a pixel circuit in a sub-pixel of a display substrate according to an embodiment of the present disclosure.
Figure 4:
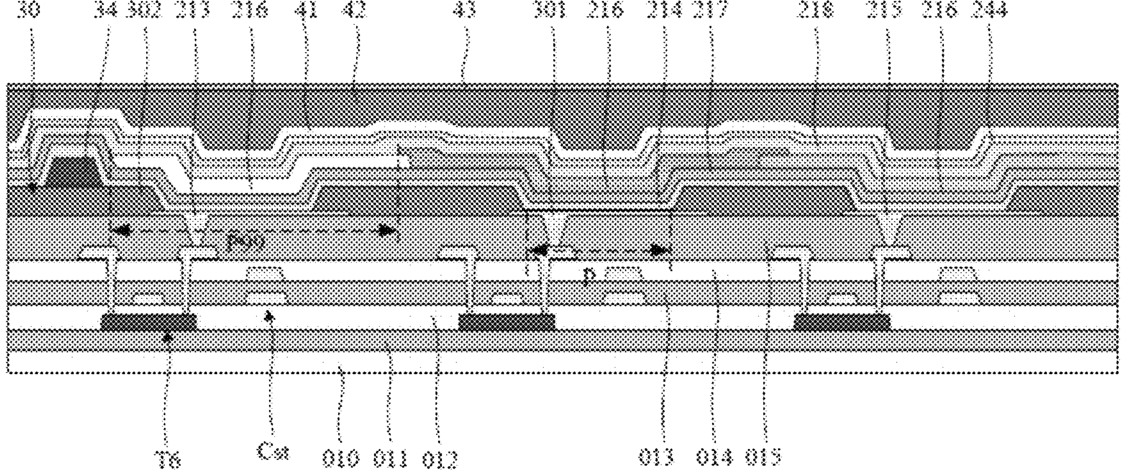
FIG. 4 is a schematic cross-sectional view of a partial structure of a display substrate according to an embodiment of the present disclosure.

In the embodiment of the present disclosure, the sub-pixels are provided on the base substrate, and there is an interval between positions where different sub-pixels are located for providing pixel circuits for driving the sub-pixels, and various leads, electrodes and the like for providing driving signals for the pixel circuits. For example, referring to FIG. 3, each pixel circuit may include a first transistor T1, a second transistor T2, a third transistor T3, a fourth transistor T4, a fifth transistor T5, a sixth transistor T6, a seventh transistor T7, and a storage capacitor Cst, and drive the organic light emitting diode (OLED) device of the corresponding sub-pixel to operate to emit light of a desired brightness under the control of driving signals such as a positive driving signal (VDD), a negative driving signal (VSS), a gate driving signal (Gate), a data driving signal (Data), a reset driving signal (Reset'), an initialization driving signal (Vinit), a switching driving signal (EM), and the like. Since the pixel circuit includes seven transistors and one capacitor, the pixel circuit is called a 7T1C pixel circuit. It should be understood that the pixel circuit may be in other specific forms, such as a 2T1C pixel circuit, or a 3T1C pixel circuit or the like.

In the embodiment of the present disclosure, some layers of the organic light emitting diode device of the sub-pixel may exceed the sub-pixel with a margin. For example, cathodes of all sub-pixels in the whole display substrate may have a one-piece cathode layer, and a coverage of a light emitting layer of each sub-pixel may exceed the sub-pixel with a margin. Therefore, in the embodiment of the present disclosure, a coverage of the sub-pixel is based on a region capable of emitting light formed by the cathode, the light emitting layer, and the anode being directly in contact with each other and stacked.

In the embodiment of the present disclosure, a pixel definition layer (PDL) is used to define the coverage of the above sub-pixel. The pixel definition layer includes a plurality of pixel definition layer openings with pixel definition parts arranged between the pixel definition layer openings; the cathode, the light emitting layer and the anode may be in contact with each other only at the pixel definition layer openings to form the organic light emitting diode device. Even if the cathode, the light emitting layer and the anode exist at the pixel definition part at the same time, one of the cathode, the light emitting layer and the anode (such as the anode) is separated from the other two (such as the light emitting layer and the cathode) by the pixel definition part, so that the cathode, the light emitting layer and the anode cannot be in contact with each other, and thus the organic light emitting diode device cannot be formed. Therefore, each sub-pixel is located in the pixel definition layer opening of the pixel definition layer, that is, a coverage of the pixel definition layer opening is the coverage of the sub-pixel, and the pixel definition part corresponds to the interval between the sub-pixels.

In the embodiment of the present disclosure, a first direction and a second direction are two directions crossing with each other and parallel to the base substrate, i.e. an angle between the first direction and the second direction may be any angle other than 0. As one mode of the embodiment of the present disclosure, the first direction and the second direction may be perpendicular to each other. For example, one of the first direction and the second direction is a row direction, and the other is a column direction. In a part of the embodiment of the present disclosure, as an example, the first direction is a row direction, and the second direction is a column direction for description. It should be understood that the row direction and the column direction are only two relative directions in the display substrate, and are not related to a shape, an arrangement or the like of the display substrate.

To further explain the structure of the display substrate according to the embodiment of the present disclosure, in combination with a method for manufacturing a display substrate, a structure of some layers in the display substrate according to the embodiment of the present disclosure are exemplarily described below. FIG. 1 is a schematic partial cross-sectional view of a structure of a display substrate according to an embodiment of the present disclosure.

As shown in FIGS. 1 to 17, a method for manufacturing a display substrate according to an embodiment of the present disclosure may specifically include the following steps:

S001, forming a base substrate on a glass carrier plate.

As a mode of the embodiment of the present disclosure, the base substrate 010 of the display substrate may be a flexible base substrate.

For example, the base substrate 010 may include a first flexible material layer, a first inorganic material layer, a semiconductor layer, a second flexible material layer, and a second inorganic material layer, which are sequentially stacked. The first flexible material layer and the second flexible material layer may be made of polyimide (PI), polyethylene terephthalate (PET) or a surface-treated polymer flexible film or the like. The first and second inorganic material layers may be made of silicon nitride (SiNx) or silicon oxide (SiOx) or the like, to improve a water and oxygen resistance of the base substrate 010, and thus the first and second inorganic material layers are referred to as barrier layers. The semiconductor layer may be made of amorphous silicon (a-si).

For example, taking materials of the stacked structure of the base substrate 010 as PI1/Barrier1/a-si/PI2/Barrier2 as an example, the process for forming the base substrate may include: coating a layer of polyimide on the glass carrier plate, and forming the first flexible material layer (PI1) through curing and film-forming; subsequently, depositing a layer of inorganic material on the first flexible material layer, to form the first barrier layer (Barrier1) covering the first material layer; then, depositing a layer of amorphous silicon on the first barrier layer, to form an amorphous silicon layer (a-si) covering the first barrier layer; then, coating a layer of polyimide on the amorphous silicon layer, and forming the second flexible material layer (PI2) through curing and film-forming; then, depositing a layer of inorganic material on the second flexible material layer to form the second barrier layer (Barrier2) covering the second flexible material layer; finally, separating the first flexible material layer from the glass carrier plate by means of a laser lift-off process or the like, to obtain the base substrate 010.

S002, forming a driving structure layer on the base substrate 010 with the structure.

The driving structure layer includes a plurality of pixel circuits, and leads and the like for supplying various driving signals to the pixel circuits. Each pixel circuit may include a plurality of transistors and at least one storage capacitor Cst. For example, each pixel circuit is the 7T1C pixel circuit, 2T1C pixel circuit, 3T1C pixel circuit, or the like.

In FIG. 1 and the following description, for the pixel circuit for each sub-pixel P, a structure of only one transistor (e.g., the sixth transistor T6 in FIG. 3) is shown as an example for explanation. However, it should be understood that it does not represent all the structures in the pixel circuit. Accordingly, a process for forming the driving structure layer may include:

A first insulating film and a semiconductor film are sequentially deposited on the base substrate 010, and the semiconductor film is patterned through a patterning process to form a first insulating layer 011 covering the entire base substrate 010 and an active layer pattern provided on the first insulating layer 011. The active layer pattern includes active regions of the transistors, and may have a partially conducting semiconductor structure as leads or the like for connecting different active regions.

Subsequently, a second insulating film and a first metal film are sequentially deposited, and the first metal film is patterned through a patterning process to form a second insulating layer 012 covering the active layer pattern and a first gate metal layer pattern disposed on the second insulating layer 012. The first gate metal layer pattern includes gate electrodes of some transistors and first electrodes of the storage capacitors Cst.

Subsequently, a third insulating film and a second metal film are sequentially deposited, and the second metal film is patterned through a patterning process to form a third insulating layer 013 covering the first gate metal layer and a second gate metal layer pattern disposed on the third insulating layer 013. The second gate metal layer pattern includes second electrodes of the storage capacitors Cst, and the like, wherein each second electrode is opposite to the first electrode of the corresponding storage capacitor Cst.

Subsequently, a fourth insulating film is deposited and patterned through a patterning process to form a fourth insulating layer 014 covering the second gate metal layer; the fourth insulating layer 014 is provided with at least two first vias therein, and portions of the fourth insulating layer 014, the third insulating layer 013 and the second insulating layer 012 in the two first vias are etched away to expose surfaces of the active regions.

Subsequently, a third metal film is deposited, and patterned through a patterning process, to form a source-drain metal layer pattern on the fourth insulating layer 014, where the source-drain metal layer includes source electrodes and drain electrodes of some transistors (e.g., the sixth transistor T6 in FIG. 3) connected to corresponding active regions through the first vias, respectively.

As one mode of the embodiment of the present disclosure, the first insulating layer 011, the second insulating layer 012, the third insulating layer 013, and the fourth insulating layer 014 may be made of an inorganic insulating material, such as any one of silicon oxide (SiOx), silicon nitride (SiNx), and silicon oxynitride (SiON) or a combination thereof. Each insulating layer may be a single-layer structure, or a multi-layer composite structure, etc.

The first insulating layer 011 is also referred to as a buffer layer (Buffer), and is used to improve the water and oxygen resistance of the base substrate 010 and to improve the adhesion of the subsequent structure to the base substrate 010. The second insulating layer 012 and the third insulating layer 013 are used to isolate the gate electrodes and the active regions of the transistors, and are also referred to as gate insulators (GI). The fourth insulating layer 014 is used to isolate portions of the conductive structures disposed in different layers, and is also referred to as an interlayer dielectric (ILD).

The first metal film, the second metal film, and the third metal film are made of a conductive metal material, such as any one of silver (Ag), copper (Cu), aluminum (Al), titanium (Ti), and molybdenum (Mo), or a combination (alloy) of metals, such as aluminum neodymium (AlNd) alloy, molybdenum niobium (MoNb) alloyb, or the like. Each metal film may be a single-layer structure or a multi-layer composite structure, such as a Ti/Al/Ti multi-layer composite structure.

An active layer film is made of a semiconductor material, for example, a metal oxide semiconductor material such as an amorphous indium gallium zinc oxide material (a-IGZO), zinc oxynitride (ZnON), or indium zinc tin oxide (IZTO), or a silicon-based semiconductor material such as amorphous silicon (a-Si) or polycrystalline silicon (p-Si), or an organic semiconductor material such as sexithiophene or polythiophene. That is, the present disclosure is appropriate for a transistor formed based the oxide technology, the silicon technology and the organic matter technology.

S003, forming a planarization layer (PLN) on the base substrate 010 with the above structure.

As one mode of the embodiment of the present disclosure, a flat film of an organic material is coated on the base substrate 010 with the above structure, to form the planarization layer 015 covering the entire base substrate 010; and a plurality of second vias are formed in the planarization layer 015 through processes of masking, exposure, development, and the like, so as to expose surfaces of drain electrodes of the transistors (for example, the sixth transistor T6 in FIG. 3) of the sub-pixels P, respectively.

The planarization layer 015 has a large thickness and a good leveling property, to eliminate a segment gap (undulation) of a lower structure, so that a subsequent organic light emitting diode (OLED) device may be formed on a relatively flat base, thereby improving the light emitting effect of the OLED.

S004, forming a first electrode pattern on the base substrate 010 with the above structure.

As a mode of the embodiment of the present disclosure, a conductive film is deposited on the base substrate 010 with the above structure, and patterned through a patterning process, to form the first electrode pattern, including first electrodes of the organic light emitting diode devices of the respective sub-pixels P connected to drain electrodes of the transistors (for example, the sixth transistor T6 in FIG. 3) through the second vias, respectively.

In some examples, the first electrode is an anode 213. Further, the first electrode is a reflective anode.

In some examples, the anode 213 may be made of a metal material, such as any one of magnesium (Mg), silver (Ag), copper (Cu), aluminum (Al), titanium (Ti), and molybdenum (Mo), or a combination thereof, such as an aluminum neodymium alloy (AlNd) or a molybdenum niobium alloy (MoNb); the anode 213 may be a single-layer structure, or a multi-layer composite structure, such as a Ti/Al/Ti multi-layer composite structure; alternatively, the anode 213 may be a stack structure formed by reflective metal and transparent conductive material, such as a stack structure of ITO/Ag/ITO, Mo/AlNd/ITO, or the like.

S005, forming a pixel definition layer pattern on the base substrate 010 with the above structure.

As one mode of the embodiment of the present disclosure, a pixel definition film is coated on the base substrate 010 with the above structure, and a portion of the pixel definition film is removed through masking, exposure, and development processes, thereby forming the pixel definition layer (PDL).

The pixel definition layer 30 includes a plurality of pixel definition layer openings 301 corresponding to positions where the portion of the pixel definition film is removed, and pixel definition parts 302 located between the pixel definition layer openings 301; the pixel definition layer openings 301 expose at least a portion of surfaces of the anodes 213 of the sub-pixels P. Thus, the light emitting layer 216, which is subsequently formed, may be in contact with the anode 213 of the corresponding sub-pixel P only at the pixel definition layer openings 301, so that the pixel definition layer openings 301 defines positions of the sub-pixels P and the pixel definition parts 302 are located at the interval among the sub-pixels P.

In some examples, the pixel definition layer 30 may be made of polyimide, acryl, or polyethylene terephthalate.

As one mode of the embodiment of the present disclosure, a post spacer 34 (PS, or a pixel support) may also be formed when the pixel definition layer 30 is formed.

The post spacer 34 is located at a pixel definition part 302, i.e. at the interval among the sub-pixels P, and protrudes from the pixel definition parts 302, so as to support a fine metal mask (FMM) in a subsequent evaporation process.

In the masking and exposing processes for the pixel definition film, different portions of the pixel definition film are exposed to different degrees by using a "halftone mask" or a "gray-scale mask", so that after the developing process, a portion (corresponding to the pixel definition layer openings 301) of the pixel definition film is removed; a thin portion (corresponding to a single pixel definition part 302) of the pixel definition film is retained; and a thick portion (corresponding to the pixel definition part 302 provided with the post spacer 34 thereon) of the pixel definition film is retained, that is, the post spacer 34 having a "one-piece structure" with the pixel definition part 302 is obtained, and thus a material of the post spacer 34 is the same as that of the pixel definition layer 30.

The post spacer 34 may be distributed only at the interval among some of the sub-pixels P. For example, for three sub-pixels P in FIG. 1, only one post spacer 34 is provided.

Alternatively, it should be understood that it is also possible to form the post spacer 34 separately from the pixel definition layer 30 by a separate process.

Figure 7:
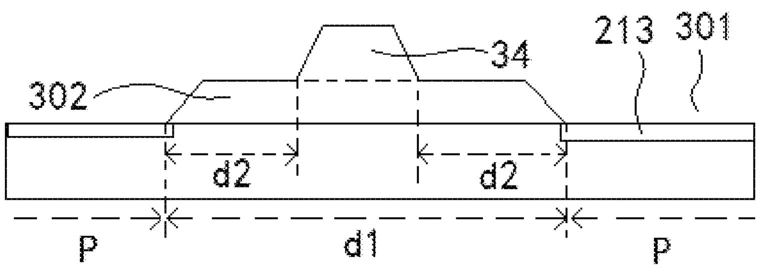
FIG. 7 is a schematic diagram illustrating a position of a partial structure of a display substrate in a cross-section along a line XX' in FIG. 6.

Referring to FIG. 7, generally, due to the limitation of the manufacturing process, an edge portion of each actually formed physical structure (e.g., the post spacer 34 and the pixel definition parts 302) is a structure which gradually thickens from a boundary thereof toward the inside, or has a "slope angle".

Thus, in the embodiment of the present disclosure, a boundary of a physical structure refers to a maximum position occupied by the structure including the "slope angle" portion, or a boundary of an orthographic projection of the "whole" structure on the base substrate 010. For example, a region of the pixel definition part 302 is a region labeled with d1 in FIG. 7, and a region of the post spacer 34 is a region between two regions labeled with d2 in FIG. 7.

Accordingly, a boundary of a non-physical region is defined by the boundary of the corresponding physical structure. For example, a region of the pixel definition layer opening 301 (i.e., the sub-pixel P) is a region outside the region of the pixel definition part 302 (the region labeled with d1 in FIG. 7).

When the post spacer 34 and the pixel definition part 302 have a one-piece structure, the post spacer 34 and the pixel definition part 302 are made of the same material and have no distinct dividing interface therebetween. Since an upper side of the pixel definition part 302 has a substantially flat surface, and the post spacer 34 is disposed on the substantially flat surface, referring to FIG. 7, a portion with an angle between the surface and the flat surface exceeding a threshold (for example, the threshold may be 20 degrees, 25 degrees, 30 degrees, etc.) is used as a boundary (i.e., the "slope angle" portion) of the post spacer 34.

S006, sequentially forming a light emitting layer and a second electrode of the organic light emitting diode device on the base substrate 010 with the above structure.

In some examples, the first electrode is a cathode 218. Further, the first electrode is a transparent cathode.

The organic light emitting diode device may emit light from a side away from the base substrate 010 through the transparent cathode, thereby realizing a top emission. Accordingly, the cathode 218 may be made of a transparent material such as indium tin oxide (ITO).

In some examples, the light emitting layer of the organic light emitting diode device includes a plurality of stacked sub-layers. For example, the light emitting layer sequentially includes in a direction gradually away from the base substrate 010: a hole injection layer (HIL) 214, a hole transport layer (HTL) 215, an organic light emitting layer (EML) 216, and an electron transport layer (ETL) 217.

The hole injection layers 214, the hole transport layers 215, the electron transport layers 217, and the cathodes 218 of the organic light emitting diode devices of the sub-pixels P may have a one-piece structure, respectively, so that they may be sequentially formed on the base substrate 010 with the above structure through evaporation by using an open mask.

Referring to FIG. 1, the organic light emitting layers 216 corresponding to different sub-pixels P may be made of different materials, so that the organic light emitting layers 216 of the different sub-pixels P (e.g., a first sub-pixel P01, a second sub-pixel P02, and a third sub-pixel P03) may be sequentially formed on the base substrate 010 with the above structure through a patterning process.

Referring to FIG. 1, the organic light emitting layer 216 corresponding to each sub-pixel P may exceed the coverage of the sub-pixel P (the organic light emitting diode device) itself, so that one sub-pixel P (or a plurality of adjacent sub-pixels P of the same color) may correspond to one larger organic light emitting layer 216, and a region where the organic light emitting layer 216 is located is referred to as a "light emitting region P99" of the sub-pixel P.

Figure 5:
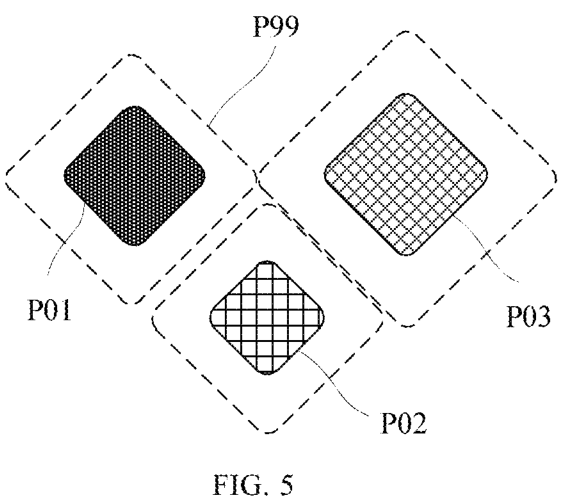
FIG. 5 is a schematic diagram illustrating a relationship between a sub-pixel and a light-emitting region of the sub-pixel in a display substrate according to an embodiment of the present disclosure.

For example, referring to FIG. 5, actual areas of the first sub-pixel P01, the second sub-pixel P02 and the third sub-pixel P03 may be smaller, and areas of the light emitting regions P99 corresponding to the first sub-pixel P01, the second sub-pixel P02 and the third sub-pixel P03 all exceed their areas. For example, a ratio of the actual area of the sub-pixel P to the area of the light emitting region P99 corresponding to the sub-pixel P may be in a range from 1:1.01 to 1:10.5, and further, may be in a range from 1:1.1 to 1:1.3.

A shape and a size of the light emitting region P99 substantially correspond to those of the opening in the fine metal mask used for forming the organic light emitting layer of the sub-pixel P.

In terms of process, the openings in the fine metal mask used for forming the organic light emitting layer may be connected with each other or overlap with each other. That is, the different sub-pixels P are arranged at intervals, but referring to FIG. 5, the light emitting regions P99 of the different sub-pixels P may be connected with each other or overlap with each other.

In some examples, the cathode 218 may be a transflective cathode, such that a "resonant micro-cavity" may be formed between the transflective cathode and the reflective anode, to enhance the purity and brightness of the emitted light.

Thus, the light emitting layer may further include: a micro-cavity adjusting layer positioned between the hole transport layer 215 and the organic light emitting layer 216, to adjust a thickness of the "resonant micro-cavity" for the different sub-pixels P.

In some exemplary embodiments, the cathode 218 may be made of any one of magnesium (Mg), silver (Ag), and aluminum (Al) or a combination (alloy) of metals. Alternatively, the cathode 218 may be made of a transparent conductive material, such as indium tin oxide (ITO). Alternatively, the cathode 218 may employ a multi-layer composite structure made of metal and transparent conductive material.

In some examples, a light coupling layer may be further formed on a side of the cathode 244 away from the base substrate 010, and may be a common layer of the plurality of sub-pixels P. The light coupling layer may cooperate with the transparent cathode to increase the light output. For example, a material of the light coupling layer may be a semiconductor material.

S007, forming an encapsulation layer on the base substrate 010 with the above structure.

As one mode of the embodiment of the present disclosure, the encapsulation layer may be continuously formed on the base substrate 010 with the above structure, so as to encapsulate structures located thereunder, and prevent the structures (especially, the light emitting layer) from being corroded by moisture and oxygen in the environment.

In some examples, the encapsulation layer may include a first encapsulation layer 41, a second encapsulation layer 42, and a third encapsulation layer 43, which are sequentially stacked; the first encapsulation layer 41 may be made of an inorganic material, the second encapsulation layer 42 may be made of an organic material, and the third encapsulation layer 43 may be made of an inorganic material. That is, the encapsulation layer may employ a three-layer stack structure of inorganic layer/organic layer/inorganic layer. Alternatively, the specific form of the encapsulation layer is not limited thereto. For example, in other examples, the encapsulation layer may also employ a five-layer stacked structure of inorganic layer/organic layer/inorganic layer/organic layer/inorganic layer.

In the related art, referring to FIG. 1, after the post spacer 34 is formed, the fine metal mask FMM needs to be in contact with the post spacer 34 while continuing to form subsequent structures through an evaporation process, so that the fine metal mask FMM is supported by the post spacer 34.

Due to the double effect of the gravity subjected by the base substrate 010 and an adsorption magnetic force (a gauss force) for attaching the fine metal mask FMM, a certain deformation and stress exist, and the transmission of the stress causes a slight friction between the post spacer 34 and the fine metal mask FMM, so that a material (such as a material of the hole injection layer 214) on the post spacer 34 in contact with the fine metal mask FMM falls off, and particles PT are generated.

Figure 2:
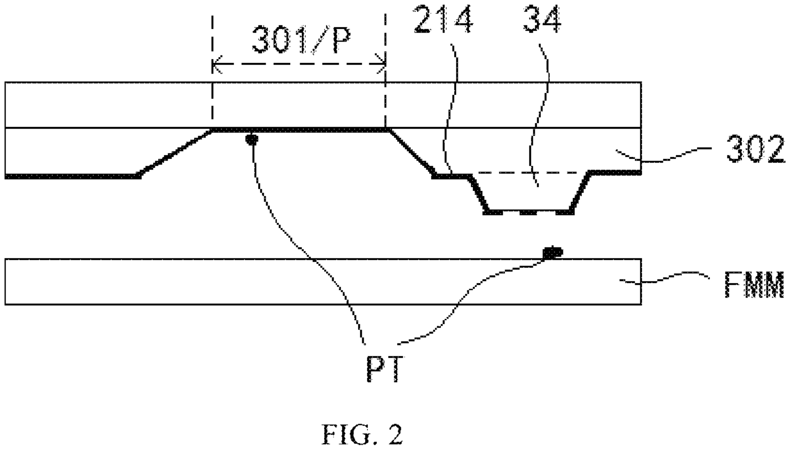
FIG. 2 is a schematic cross-sectional view of a structure of a display substrate separated from a fine metal mask during deposition in the related art.

Referring to FIG. 2, after the fine metal mask FMM is separated from the display substrate, the particles PT may be adhered to the fine metal mask FMM or fall into a region where the sub-pixels P of the display substrate are located, thereby causing defects such as dark spots and dead spots, reducing the display effect, and causing reliability and yield problems.

In a first aspect, referring to FIGS. 1 to 17, an embodiment of the present disclosure provides a display substrate.

The display substrate of the embodiment of the present disclosure may be an array substrate, and further may be an array substrate for an organic light emitting diode (OLED) display.

The display substrate of the embodiment of the present disclosure includes a base substrate 010, and a plurality of sub-pixels P arranged in an array at intervals on the base substrate 010; wherein Spacer regions are arranged between the adjacent sub-pixels P; the spacer regions include first spacer regions 91 having functional positions, and second spacer regions 92 having no functional positions;

Functional parts are arranged at at least some functional positions; and

A width of the first spacer region 91 is greater than that of the second spacer region 92; wherein a width of the spacer region is equal to a shortest distance between boundaries of the two sub-pixels P corresponding to the spacer region.

Each of the spacer regions (e.g., the first spacer region 91 and the second spacer region 92) is located between two sub-pixels P, so that a width of a spacer region, that is, for example, a distance between two sub-pixels P on both sides of the spacer region (that is, an interval of the two sub-pixels P in the arrangement direction), is a distance between boundaries of the two sub-pixels P closest to each other on a line connecting geometric centers of the two sub-pixels P. Thus, an extending direction of the line (or the arrangement direction of the two sub-pixels P) is a width direction of the spacer region.

Further, the two sub-pixels P on both sides of each spacer region are necessarily arranged in a certain direction (e.g., the row direction or the column direction). Thus, a comparison for the widths of different spacer regions (the first spacer region 91 and the second spacer region 92) should be that for spacer regions located between sub-pixels P arranged in the same direction (or in substantially the same direction); or the widths of different spacer regions should be compared when the width directions of the two spacer regions are the same (or substantially the same) (i.e., when the two spacer regions are located between sub-pixels P arranged in the same direction).

A "functional position" refers to a position available for providing the functional part in the spacer region between the sub-pixels P. A "functional part" refers to a structure provided in the spacer region for realizing a certain function.

For example, the functional part may be a sensor such as an infrared sensor, a fingerprint sensor, or the like; alternatively, the functional part may also be an auxiliary conductive pillar for connecting with the cathode to perform an auxiliary conductive function; alternatively, the functional part may be a blocking structure or the like that performs an optical or electrical blocking function, for example, a separating structure for separating a layer such as a common layer (the electron transport layer, the hole transport layer, the cathode, or the like) to reduce crosstalk; alternatively, the functional part may be a lens structure, a reflective structure, or the like for enhancing the light outgoing efficiency.

In some embodiments, although a projection of the functional position on the base substrate is located between two sub-pixels P (e.g., pixel definition layer openings), the functional part is not necessarily located in the same layer as at least some of the layers of the sub-pixels P. For example, the functional part may be located on the pixel definition layer; alternatively, the functional part may be located in the same layer as the pixel definition layer (for example, the pixel definition layer has functional openings other than sub-pixel openings for displaying, and the functional part is located in the functional openings of the pixel definition layer); alternatively, the functional part may be located on a side of the pixel definition layer close to the base substrate (e.g., in an interval for the anodes of the sub-pixels, or in the opening of the planarization layer on a side of the anode close to the base substrate, etc.).

In some embodiments, the functional position is a post spacer position 911 for providing the post spacer, and the functional part is the post spacer 34 (PS).

As one mode of the embodiment of the present disclosure, the functional part is the post spacer 34 for supporting, and the corresponding functional position is the post spacer position 911 for providing the post spacer. Alternatively, other functional devices (such as the sensor, the auxiliary conductive pillar, the separating structure, the lens structure, etc.) may be provided in the post spacer position 911 for providing the post spacer 34.

In the following part of the embodiment of the present disclosure, as an example, the post spacer position 911 is the functional position, and the post spacer 34 is the functional part for description. It should be understood that in the following description, the post spacer position 911 may be replaced by the functional position, and the post spacer 34 may be replaced by the functional part, but the functional position and the functional part are not limited to the post spacer position 911 and the post spacer 34, respectively.

Figure 6:
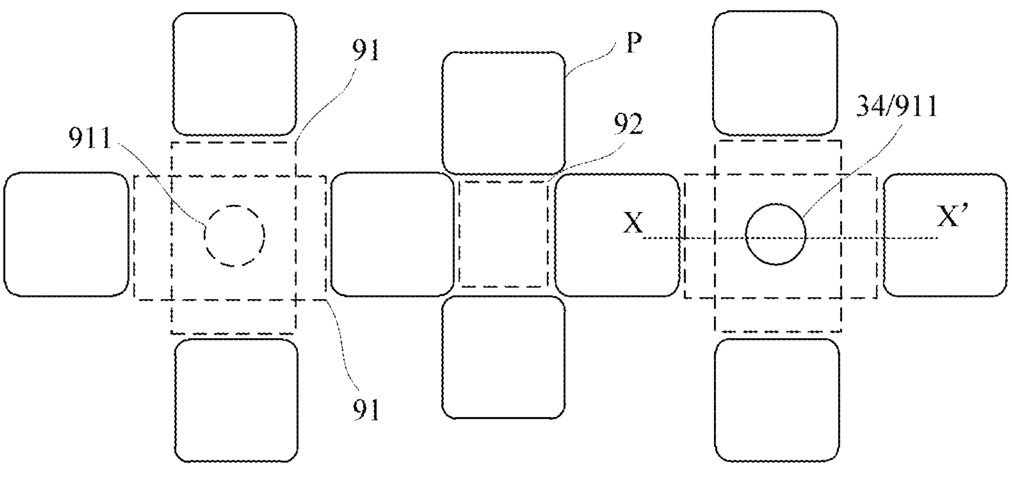
FIG. 6 is a schematic diagram illustrating a local distribution of a partial structure of a display substrate according to an embodiment of the present disclosure.

In the embodiment of the present disclosure, referring to FIG. 6, the spacer regions between the sub-pixels P are divided into two types, wherein one type of the spacer region has a larger width (larger than that of a spacer region in the related art) and is a first spacer region 91 having the post spacer position 911; and the other type of the spacer region has a smaller width (unchanged compared with that of the spacer region in the related art) and is a second spacer region 92, and the post spacer 34 (PS) is only disposed in the post spacer position 911 (but not all the post spacer positions 911 are necessarily provided with the post spacers 34).

That is, in the embodiment of the present disclosure, the post spacer 34 is disposed only in the first spacer region 91 having the larger width, but is impossibly provided in the second spacer region 92.

Therefore, in the display substrate according to the embodiment of the present disclosure, the interval (the first spacer region 91) between some of the sub-pixels P is "enlarged"; and the post spacer 34 is disposed in the "enlarged" interval, so that a distance between the post spacer 34 and the sub-pixels P is increased, the generation of particles PT in the evaporation process is reduced, the defects of dark spots, dead spots and the like for the particles PT are further reduced, the product yield and reliability are improved, a passing rate of the display substrate product to 8585 tests (tests at 85° C. and 85% relative humidity) for 500 h (hours) and 1000 h is increased, and the display quality is improved.

Meanwhile, in the display substrate according to the embodiment of the present disclosure, only the first spacer region 91 where the post spacer 34 may be disposed is "enlarged", and a size of the second spacer region 92 between the other sub-pixels P is not changed, so that the overall distribution of the sub-pixels P is not changed, that is, a resolution (PPI, Pixels Per Inch) of the display substrate is not changed (certainly, an aperture ratio may be reduced to some extent), the display effect is not significantly affected, and the requirement of high resolution can be satisfied.

In some embodiments, a width of the first spacer region 91 is greater than or equal to 20 μm.

In some embodiments, a distance between a boundary of the post spacer 34 (the post spacer position 911) and a boundary of the closest sub-pixel P is greater than or equal to 3 μm.

In some embodiments, a width of the second spacer region 92 is less than or equal to 19 μm.

The applicant has found in a creative way after research that referring to FIGS. 6 and 7, when a width d1 of the first spacer region 91 having the post spacer 34 (i.e., a width of the entire pixel definition part 302) is greater than or equal to 20 μm, and the distance d2 between the post spacer 34 and the boundary of the closest sub-pixel P (i.e., the distance between the boundary of the post spacer 34 and the boundary of the pixel definition part 302 where the post spacer 34 is located) is greater than or equal to 3 μm, the better effect of avoiding the generation of the particles PT can be achieved.

When the pixel definition part 302 is provided in the spacer region, the pixel definition part 302 is located in the spacer region. However, due to the process limitation, referring to FIG. 7, generally, an edge portion of the pixel definition part 302 is a structure which gradually thickens from a boundary thereof toward the inside, or has a "slope angle", so that a cross-section of the pixel definition part 302 is approximately trapezoidal, and thus, the spacer region should correspond to a whole region where the pixel definition part 302 is located, i.e., a size of a "widest" bottom side of the trapezoid of the pixel definition part 302. For example, the spacer region generally covers an edge of the anode 213.

Any post spacer 34 may be adjacent to sub-pixels P. In this case, there are a plurality of distances, each of which is a distance between the post spacer 34 and a corresponding one of the sub-pixels P adjacent to the post spacer 34. The distances may be all the same, or all different from each other (i.e. any two distances are different from each other), or may be partially the same, or partially different.

In contrast, the width of the second spacer region 92 without the post spacer (or the width of the interval between the sub-pixels P in the related art) may be less than or equal to 19 μm.

The width d1 of the first spacer region 91 with the post spacer 34 may further be greater than or equal to 21 μm, greater than or equal to 22 μm, greater than or equal to 24 μm, greater than or equal to 26 μm, greater than or equal to 28 μm, or greater than or equal to 30 μm, etc.

The distance d2 between the post spacer position 911 and the boundary of the closest sub-pixel P may further be greater than or equal to 4 μm, greater than or equal to 5 μm, greater than or equal to 6 μm, greater than or equal to 7 μm, or greater than or equal to 8 μm, etc.

The width d1 of the second spacer region 92 without the post spacer may further be less than or equal to 18 μm, or less than or equal to 16 μm, etc.

For example, as shown in table 1 below, when a size and a spacing size of the post spacer 34 between two sub-pixels P are different, a determination for a corresponding profile of the post spacer is also different, and the sizes meeting the above requirement in the embodiment of the present disclosure can ensure that the determination for the profile of the post spacer is qualified.

TABLE 1

Profile of a post spacer under different sizes

| | d1(μm) | d2(μm) | Width of a post spacer (μm) | Determination for a profile of a post spacer |
|---|---|---|---|---|
| The embodiment of the present disclosure | 25.4 | 6.2 | 13 | Qualified |
| Related art | 21 | 4 | 13 | Unqualified |

In some embodiments, the shortest connecting line between boundaries of two sub-pixels P corresponding to at least a first spacer region 91 passes through the post spacer 34 in the first spacer region 91.

In some embodiments, in a cross-section passing through the shortest connecting line and perpendicular to the base substrate 010, a distance between the boundaries of the two sub-pixels P corresponding to the first spacer region 91 is greater than or equal to 20 μm, and a distance between the post spacer position 911 in the first spacer region 91 and each of the sub-pixels P is greater than or equal to 3 μm.

As one mode of the embodiment of the present disclosure, referring to FIG. 6, at least some post spacer positions 911 may each pass through the position between adjacent sub-pixels P where the shortest connecting line passes through, so that if the post spacer 34 is disposed on the post spacer position 911, the shortest connecting line between the boundaries of the two corresponding sub-pixels P also passes through the post spacer 34 on the post spacer position 911. Referring to FIG. 7, in a cross-section at the position where the shortest connecting line passes through, sizes of the post spacer position 911 and the interval also meet the above requirement.

In some embodiments, a connecting line between geometric centers of two sub-pixels P corresponding to at least a first spacer region 91 passes through the post spacer 34 in the first spacer region 91.

In some embodiments, the connecting line between the geometric centers of the two sub-pixels P corresponding to at least the first spacer region 91 passes through a geometric center of the post spacer 34 in the first spacer region 91.

As another mode of the embodiment of the present disclosure, referring to FIG. 6, at least a post spacer position 911 (and the post spacer 34 thereon) may also pass through the connecting line between the geometric centers of the adjacent sub-pixels P. Further, a geometric center of each post spacer position 911 (and the post spacer 34 thereon) itself may be located on the connecting line between the geometric centers of the adjacent sub-pixels P.

A pattern of the post spacer 34 in a cross-section perpendicular to the base substrate 010 and passing through any of the connecting lines may be eudipleural. For example, the pattern may be the trapezoid as shown in FIG. 7.

In some embodiments, at least some first spacer regions 91 extend in a third direction; at least some first spacer regions 91 extend in a fourth direction; the fourth direction intersects the third direction; the at least some first spacer regions 91 extending in the third direction and the at least some first spacer regions 91 extending in the fourth direction have an overlapping region therebetween, and at least some post spacers 34 at least partially overlap the overlapping region.

Referring to FIG. 6, a spacer region may be provided between any adjacent sub-pixels P, and the sub-pixels P may be adjacent to each other in different directions, so that there may be spacer regions extending in different directions between the sub-pixels P adjacent to each other in the different directions. For example, in FIG. 6, a spacer region is provided between the sub-pixels P adjacent to each other in a "lateral direction" and extends in the "lateral direction", and a spacer region is provided between the sub-pixels P adjacent to each other in a "longitudinal direction" and extends in the "longitudinal direction". The above different spacer regions may also have an overlapping region therebetween.

Thus, if there are two first spacer regions 91 extending in different directions and having an overlapping region therebetween, there may be a post spacer 34 (a post spacer position 911) at least partially or completely located in the overlapping region. That is, referring to FIG. 6, the post spacer 34 (the post spacer position 911) is simultaneously located between a plurality of "pairs" of different adjacent sub-pixels P, so that the post spacer 34 (the post spacer position 911) may also "simultaneously belong to" a plurality of first spacer regions 91.

It should be understood that when the post spacer 34 (the post spacer position 911) simultaneously belongs to the plurality of spacer regions, any one of the spacer regions should be the above first spacer region 91, and should meet the above width requirement.

The third direction and the fourth direction only represent two different directions, which does not mean that the third direction and the fourth direction are necessarily perpendicular to each other.

An extending direction of a spacer region may also be a width direction of the spacer region, for example, the extending direction of the connecting line between the geometric centers of the two sub-pixels P on the two sides of the spacer region.

The spacer region has various specific shapes, which is determined according to a shape of the region between the two sub-pixels P where the spacer region is located. For example, the spacer region may have a bar shape (or a rectangular shape), or a circular shape or an oval shape. For another example, the spacer region may have a relatively regular and symmetrical shape having a symmetrical axis, or any other irregular shape.

It should be understood that the spacer region belongs to the first spacer region 91, regardless of the specific shape of the spacer region as long as a dimension of the spacer region in a width direction meets the above requirement, so that the post spacer 34 (the post spacer position 911) may be provided.

In some embodiments, a distance between adjacent post spacers 34 is between 100 μm and 300 μm.

As mentioned above, the post spacer position 911 is a position where the post spacer 34 may be provided, but which does not mean that each post spacer position 911 is actually provided with the post spacer 34, as long as a distribution density of the post spacers 34 meets the requirement of supporting the fine metal mask FMM. A distance between the post spacers 34 meeting the requirement of supporting may be in a range of 100 μm to 300 μm, further 120 μm to 280 μm, or 150 μm to 250 μm.

In some embodiments, the number of the post spacer positions 911 provided with the post spacers 34 is at least 15% of the total number of the post spacers 34.

In the embodiment of the present disclosure, at least 15% of the post spacer positions 911 may be provided with the post spacers 34. Alternatively, it is also possible that a proportion of the post spacer positions 911 provided with the post spacers 34 is at least 25%, 50%, 75%, or the like, or that all the post spacer positions 911 are provided with the post spacers 34.

Thus, if a distance between the adjacent first spacer regions 91 is smaller than the above range, referring to FIG. 6, only one of the spacer positions 911 of the plurality of first spacer regions 91 may be actually provided with the post spacer 34.

In some embodiments, the display substrate further includes the pixel definition layer 30;

The pixel definition layer 30 includes the pixel definition layer openings 301, and the pixel definition parts 302 located between the pixel definition layer openings 301;

The pixel definition layer openings 301 define light emitting regions of the sub-pixels P; and The post spacers 34 are provided on a side of the pixel definition parts 302 away from the base substrate 010.

In some embodiments, the post spacers 34 and the pixel definition parts 302 have a one-piece structure.

As one mode of the embodiment of the present disclosure, regions where the sub-pixels P are actually capable of emitting light (i.e., the sub-pixels P) may correspond to the pixel definition layer openings 301 of the pixel definition layer (PDL) 30, so that the intervals between the sub-pixels P corresponds to the pixel definition parts 302 of the pixel definition layer 30, and the post spacers 34 are provided on the pixel definition parts 302.

As one mode of the embodiment of the present disclosure, the post spacers 34 and the pixel definition parts 302 may have a one-piece structure. That is, the post spacers 34 and the pixel definition parts 302 may be formed in one material layer through one patterning process.

Alternatively, it is also possible to form the post spacers 34 as the independent structures on the pixel definition parts 302 with separate material layers through independent patterning processes.

Alternatively, if the functional part is not the post spacer 34 but another structure, the functional part may be formed through an independent patterning process, or may be provided in the same layer as other structures (e.g., the functional part and the other structures are formed through a single patterning process), and the functional part and the other structures in the same layer may be connected to each other as a whole, or may be separated from each other.

The specific arrangement of some sub-pixels P in the display substrate, and the corresponding arrangement of the first spacer regions 91 (and the post spacer positions 911 therein) and the second spacer region 92 will be exemplarily described below.

In some embodiments, in the plurality of sub-pixels P adjacent to at least some post spacers 34, at least one sub-pixel P has a geometric center offset from a straight line extending along the first direction, and at least two sub-pixels P located in the same row as the at least one sub-pixel P in the first direction have geometric centers located on the straight line;

And/or

In the plurality of sub-pixels P adjacent to the at least some post spacers 34, at least one sub-pixel P has a geometric center offset from a straight line extending along the second direction, and at least two sub-pixels P located in the same row as the at least one sub-pixel P in the second direction have geometric centers located on the straight line; the second direction intersects the first direction.

In the following description, as an example, the first direction is a row direction, and the second direction is a column direction for description. It should be understood that the above direction is not intended as a limitation on the scope of the present disclosure.

That is, the sub-pixels P1 may be arranged in rows and columns in the row direction (the first direction) and the column direction (the second direction). In the sub-pixels P1 in the same row, the sub-pixels P1 adjacent to the post spacers 34 (the post spacer positions 911) may be "offset" from other sub-pixels P1 (in terms of positions of the geometric centers) in the row, for example, offset away from the post spacers 34 adjacent thereto; in the sub-pixels P1 in the same column, the sub-pixels P1 adjacent to the post spacers 34 (the post spacer positions 911) may be "offset" from other sub-pixels P1 (in terms of positions of the geometric centers) in the column, for example, offset away from the post spacers 34 adjacent thereto.

Thus, a sufficient space may be left for the spacer regions provided with the post spacers 34 (the post spacer positions 911), so that the width requirement of the first spacer regions 91 can be met.

In some embodiments, the first sub-pixel P01 is a red sub-pixel, the second sub-pixel P02 is a green sub-pixel, and the third sub-pixel P03 is a blue sub-pixel.

As one mode of the embodiment of the present disclosure, comprehensively considering the light emitting efficiency of the organic light emitting diode (OLED) devices of different colors and the sensitivity of human eyes to light of different colors, the colors of different sub-pixels P may be set in the above way. It should be understood that the setting of the colors of the sub-pixels P does not limit the scope of the present disclosure.

Figure 8:
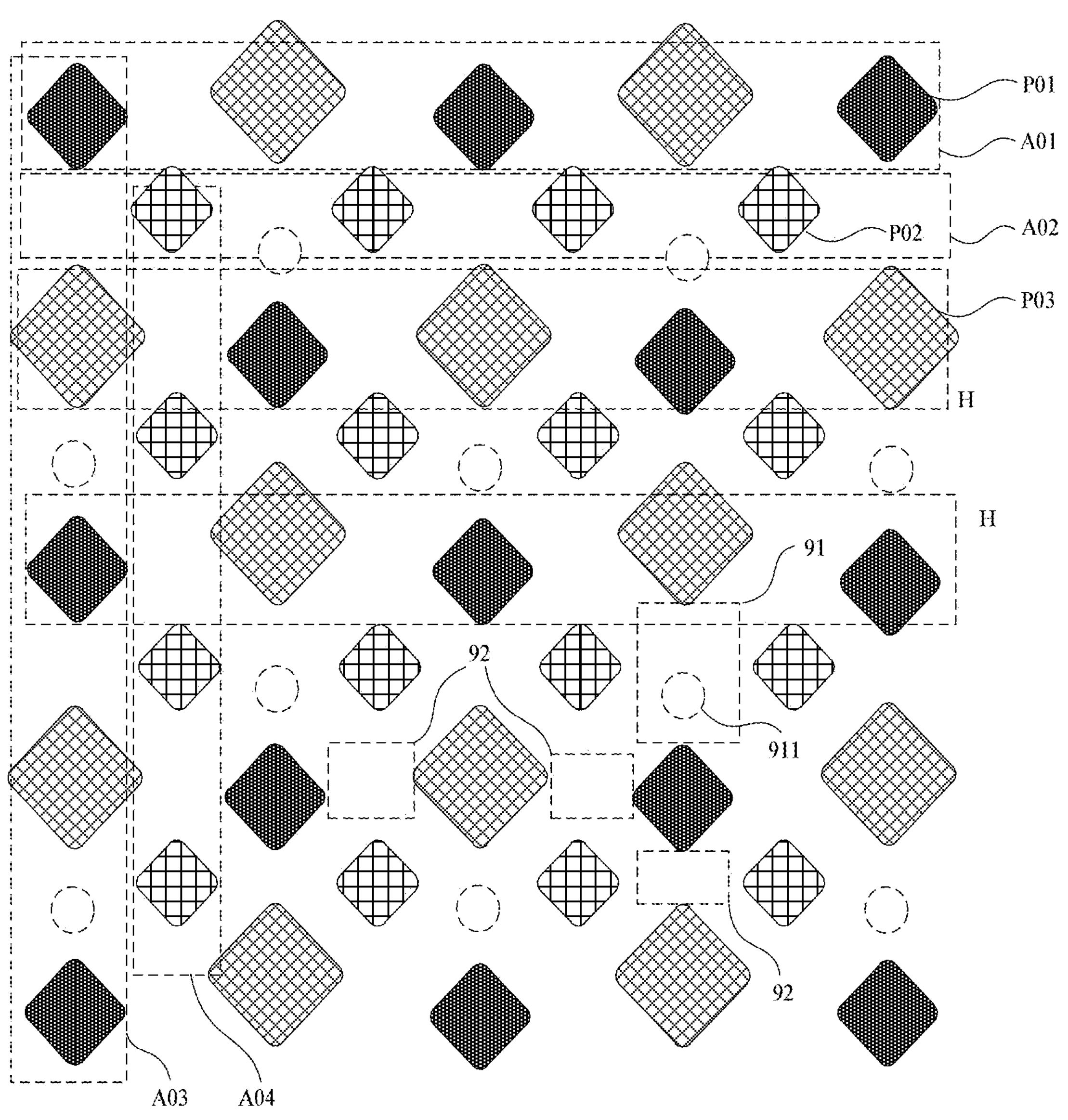
FIG. 8 is a schematic diagram illustrating a local distribution of a partial structure of a display substrate according to an embodiment of the present disclosure.

For example, referring to FIG. 8, the sub-pixels P are arranged in an array, including a plurality of first pixel rows and a plurality of second pixel rows alternately arranged. Each first pixel row is formed by red sub-pixels and blue sub-pixels which are alternately arranged, and the red sub-pixels and the blue sub-pixels in the same column and in the plurality of the first pixel rows are also alternately arranged. Each second pixel row is formed by a plurality of green sub-pixels arranged side by side, and the green sub-pixels are arranged in a staggered mode with the red sub-pixels and the blue sub-pixels in the adjacent rows. For the pixel arrangement, the pixel array may be divided into repeating units arranged in an array, each repeating unit includes two rows and four columns of sub-pixels. That is, each repeating unit includes one red sub-pixel, one blue sub-pixel and two green sub-pixels, the red sub-pixel and the blue sub-pixel are common sub-pixels. The four sub-pixels can realize the display of two virtual pixel units through a virtual algorithm. For example: the red sub-pixel in the second repeating unit in the first row, the blue sub-pixel in the first repeating unit in the first row and the closest green sub-pixel (the green sub-pixel closest to the red sub-pixel and the blue sub-pixel) form a virtual pixel unit, and the red sub-pixel and the blue sub-pixel in the second repeating unit in the first row and the green sub-pixel closest to the red sub-pixel and the blue sub-pixel form a virtual pixel unit; in addition, the blue sub-pixel and the other green sub-pixel in the second repeating unit in the first row and the closest red sub-pixel in the third repeating unit in the first row form a virtual pixel unit, so that a resolution of a display panel applying the pixel array can be effectively improved.

In some embodiments, the sub-pixels P include the first sub-pixels P01, the second sub-pixels P02, the third sub-pixels P03;

The first and third sub-pixels P01 and P03 are alternately arranged along the first direction to form first pixel groups A01, and are alternately arranged along the second direction to form third pixel groups A03; the second direction intersects the first direction;

The second sub-pixels P02 are arranged along the first direction to form second pixel groups A02, and arranged along the second direction to form fourth pixel groups A04; and The first pixel groups A01 and the second pixel groups A02 are alternately arranged along the second direction; the third pixel groups A03 and the fourth pixel groups A04 are alternately arranged along the first direction.

Figure 9:
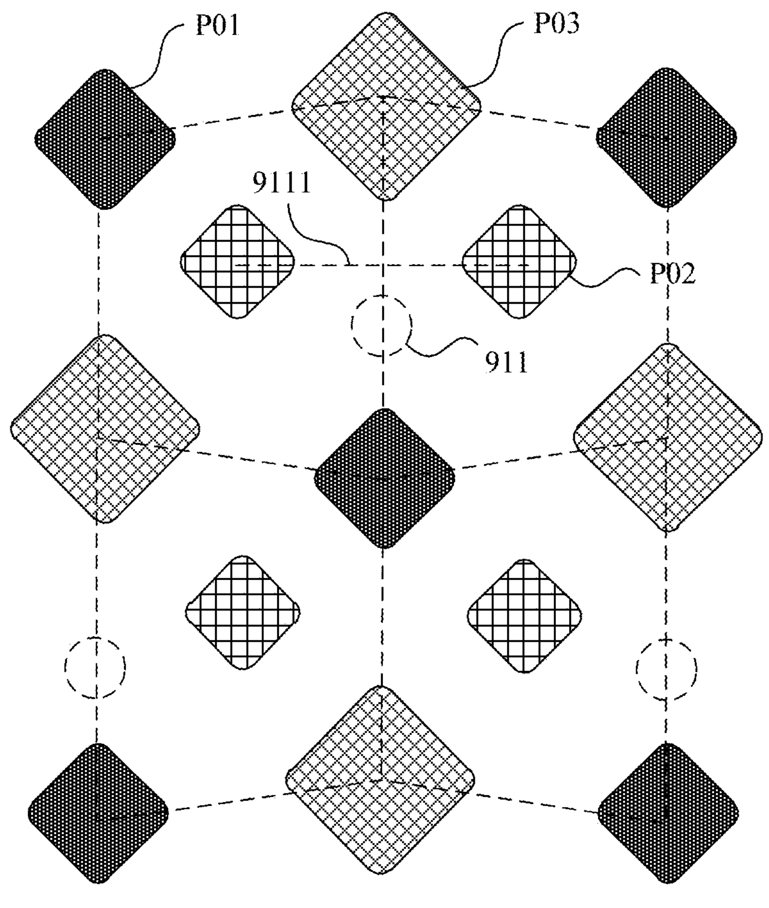
FIG. 9 is a schematic enlarged view of a partial structure in FIG. 8.

Referring to FIGS. 8 and 9, as one mode of the embodiment of the present disclosure, in the display substrate, the first sub-pixels P01 and the third sub-pixels P03 may be alternately arranged in a plurality of rows of the first pixel groups A01, the second sub-pixels P02 are arranged in a plurality of rows of the second pixel groups A02; and the first pixel groups A01 and the second pixel groups A02 are alternately arranged in the column direction; and the first sub-pixels P01 and the third sub-pixels P03 are alternately arranged in a plurality of columns of the third pixel groups A03, the second sub-pixels P02 are arranged in a plurality of columns of the fourth pixel groups A04; and the third pixel groups A03 and the fourth pixel groups A04 are alternately arranged in the row direction.

In some embodiments, in the spacer regions each between the first sub-pixel P01 and the third sub-pixel P03 adjacent to each other in the third pixel group A03, at least some spacer regions are the first spacer regions 91; and The spacer regions each between the first sub-pixel P01 and the third sub-pixel P03 adjacent to each other in the first pixel group A01 are the second spacer regions 92.

As one mode of the embodiment of the present disclosure, referring to FIGS. 8 and 9, the spacer regions each between the first sub-pixel P01 and the third sub-pixel P03 adjacent to each other in the row direction are the second spacer regions 92 having no post spacer positions; and at least a spacer region between the first sub-pixel P01 and the third sub-pixel P03 adjacent to each other in the column direction is the first spacer region 91 provided with the post spacer position 911 (the post spacer 34).

Widths of the second spacer regions 92 located in the same row (i.e. the second spacer regions 92 located between two adjacent rows of sub-pixels P) should be the same or substantially the same. For example, if a width of a second spacer region 92 with the smallest width in the plurality of second spacer regions 92 in the same row is 0.8, a relative width of a second spacer region 92 with the largest width should not exceed 1.2.

In some embodiments, the spacer regions each between the first sub-pixel P01 and the third sub-pixel P03 adjacent to each other in the third pixel group A03 are alternately arranged along the second direction as the first spacer regions 91 and the second spacer regions 92; and One of the first spacer regions 91 in one of two adjacent third pixel groups A03 and one of the second spacer regions 92 in the other one of the two adjacent third pixel groups A03 are located between two rows of sub-pixels P arranged in the first direction.

As one mode of the embodiment of the present disclosure, referring to FIGS. 8 and 9, in the spacer regions between the first sub-pixels P01 and the third sub-pixels P03 in each column, the first spacer regions 91 and the second spacer regions 92 are alternately arranged; and in the plurality of spacer regions located between two adjacent third pixel groups A03, the first spacer regions 91 and the second spacer regions 92 are also alternately arranged. For example, referring to FIGS. 8 and 9, in the spacer regions between the first sub-pixels P01 and the third sub-pixels P03 in any column, a spacer region with the third sub-pixel P03 above the spacer region and the first sub-pixel P01 below the spacer region is the first spacer region 91; and correspondingly, a spacer region where the third sub-pixel P03 is below the spacer region and the first sub-pixel P01 is above the spacer region is the second spacer region 92. Thus, the first and second spacer regions 91 and 92 (which are necessarily adjacent to each other) in the same row in two adjacent third pixel groups A03 are located between two adjacent rows of sub-pixels P, for example, between two rows of sub-pixels P labeled with H in FIG. 8.

Therefore, the post spacer positions 911 (the post spacers 34) are relatively uniformly distributed in the display substrate, which is favorable for the arrangement of the post spacer positions 911 (the post spacers 34).

Widths of the first spacer regions 91 in the same row (i.e., the first spacer regions 91 between two adjacent rows of sub-pixels P) may be the same, and widths of the second spacer regions 92 in the same row (i.e., the second spacer regions 92 between two adjacent rows of sub-pixels P) may be the same as well, so as to achieve a regular arrangement of the sub-pixels P.

In some embodiments, lines sequentially connecting geometric centers of two first sub-pixels P01 and two third sub-pixels P03 arranged in an array form a virtual trapezoid; and A spacer region between the first sub-pixel P01 and the third sub-pixel P03 corresponding to a bottom side of the virtual trapezoid is the first spacer region 91, and a spacer region between the first sub-pixel P01 and the third sub-pixel P03 corresponding to a top side of the virtual trapezoid is the second spacer region 92.

As one mode of the embodiment of the present disclosure, referring to FIG. 9, a virtual "quadrangle" formed by connecting the geometric centers of every four total of the first sub-pixels P01 and the third sub-pixels P03 is a "trapezoid", and the post spacer position 911 (the first spacer region 91) is located at a bottom side (a longer side) of the corresponding virtual trapezoid, and a top side (a shorter side) of the virtual trapezoid corresponds to the second spacer region 92.

Alternatively, for each column of the first sub-pixels P01 and the third sub-pixels P03, distances between some first sub-pixels P01 and third sub-pixels P03 may be "enlarged" (obviously, distances between other first sub-pixels P01 and third sub-pixels P03 are correspondingly reduced), and the post spacer positions 911 (the first spacer regions 91) are provided at positions where the distances are "enlarged", so as to increase the distance between the post spacer 34 and the sub-pixel P, reduce the generation of the particles PT, and improve the reliability and yield.

In some embodiments, the bottom side of the virtual trapezoid is parallel to the second direction.

In some embodiments, the virtual trapezoid is a virtual isosceles trapezoid.

Further, the bottom side of the virtual trapezoid may be parallel to the column direction. Further, the virtual trapezoid may be a virtual isosceles trapezoid (i.e., the first sub-pixels P01 and the third sub-pixels P03 are moved by a same distance).

In some embodiments, in the first spacer region 91 at least partially located between the first sub-pixel P01 and the third sub-pixel P03 adjacent to each other, a geometric center of the post spacer 34 is located on a connecting line between a geometric center of the first sub-pixel P01 and a geometric center of the third sub-pixel P03 corresponding to the first spacer region 91.

As one mode of the embodiment of the present disclosure, referring to FIG. 9, geometric centers of at least a post spacer position 911 and the post spacer 34 thereon may be located on a connecting line (e.g., the bottom side of the virtual trapezoid) between the geometric centers of the corresponding first sub-pixel P01 and third sub-pixel P03.

In some embodiments, in the first spacer region 91 at least partially located between the first sub-pixel P01 and the third sub-pixel P03 adjacent to each other, along the second direction, a distance between the geometric center of the post spacer 34 and the geometric center of the first sub-pixel P01 corresponding to the first spacer region 91 is smaller than a distance between the geometric center of the post spacer position 911 and the geometric center of the third sub-pixel P03 corresponding to the first spacer region 91.

As one mode of the embodiment of the present disclosure, referring to FIG. 9, the post spacer 34 provided on the post spacer position 911 in at least a first spacer region 91 is not "in the middle" between the corresponding first sub-pixel P01 and third sub-pixel P03 in the column direction, but is "closer" to the corresponding first sub-pixel P01 and "farther" from the corresponding third sub-pixel P03; alternatively, the post spacer position 911 is "lower".

In some embodiments, in the first spacer region 91 at least partially located between the first sub-pixel P01 and the third sub-pixel P03 adjacent to each other, along the second direction, the geometric center of the post spacer 34 is located on a side of a corresponding reference line 9111 close to the first sub-pixel P01 corresponding to the first spacer region 91; the reference line 9111 of the post spacer position 911 is a connecting line between geometric centers of the two second sub-pixels P02 located on two sides of the post spacer position 911 in the first direction.

As a mode of the embodiment of the present disclosure, referring to FIG. 9, the post spacer 34 provided on the post spacer position 911 in at least a first spacer region 91 may be "closer" to the corresponding first sub-pixel P01 than the second sub-pixel P2 in the same row in the column direction. For example, the geometric center (the reference line 9111) of the second sub-pixel P2 in the same row may be located on a connecting line between a midpoint of the top side and a midpoint of the bottom side of the corresponding virtual trapezoid. That is, the second sub-pixel P2 may be located in the middle between the first sub-pixel P01 and the third sub-pixel P03, and the second sub-pixel P2 is relatively close to the first sub-pixel P01 (the second sub-pixel P2 is lower).

In some embodiments, a shape of the first sub-pixel P01 includes a square or a rounded square, including one diagonal parallel to the first direction and the other diagonal parallel to the second direction; and A shape of the third sub-pixel P03 includes a square or a rounded square, including one diagonal parallel to the first direction and the other diagonal parallel to the second direction.

As one mode of the embodiment of the present disclosure, referring to FIGS. 8 and 9, the shapes of the first sub-pixel P01 and the third sub-pixel P03 may be the square, or the rounded square (i.e., a shape obtained by causing each corner of the square to be a rounded corner), and two diagonal lines of the square (or the rounded square) are provided along the row direction and the column direction, respectively.

Alternatively, the second sub-pixel P02 may also be a square or a rounded square, or a non-square rectangle or a rounded rectangle, or a rectangle or a rounded rectangle with a "missing" part, which will not be described in detail herein.

In some embodiments, at least a third sub-pixel P03 is divided into asymmetric first and second portions by a line passing through a geometric center of the third sub-pixel P03 and parallel to the first direction; and a maximum dimension of the first portion is smaller than that of the second portion along the second direction; in the first spacer regions 91 each between the first sub-pixel P01 and the third sub-pixel P03 adjacent to each other in the second direction, at least a first spacer region 91 is a spacer region between the first portion of the third sub-pixel P03 and the first sub-pixel P01 adjacent to the third sub-pixel P03.

Figure 10:
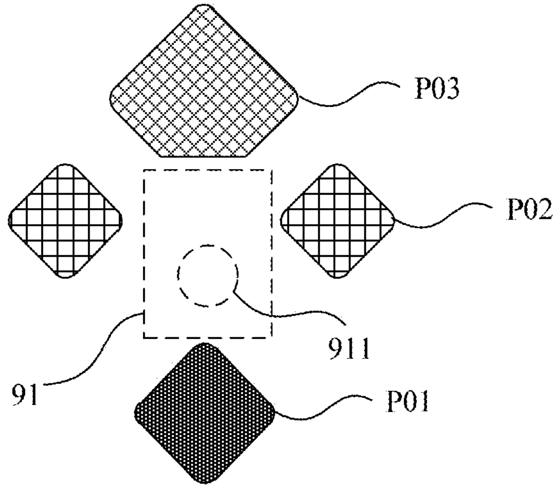
FIG. 10 is another schematic enlarged view of a partial structure in FIG. 8.
Figure 11:
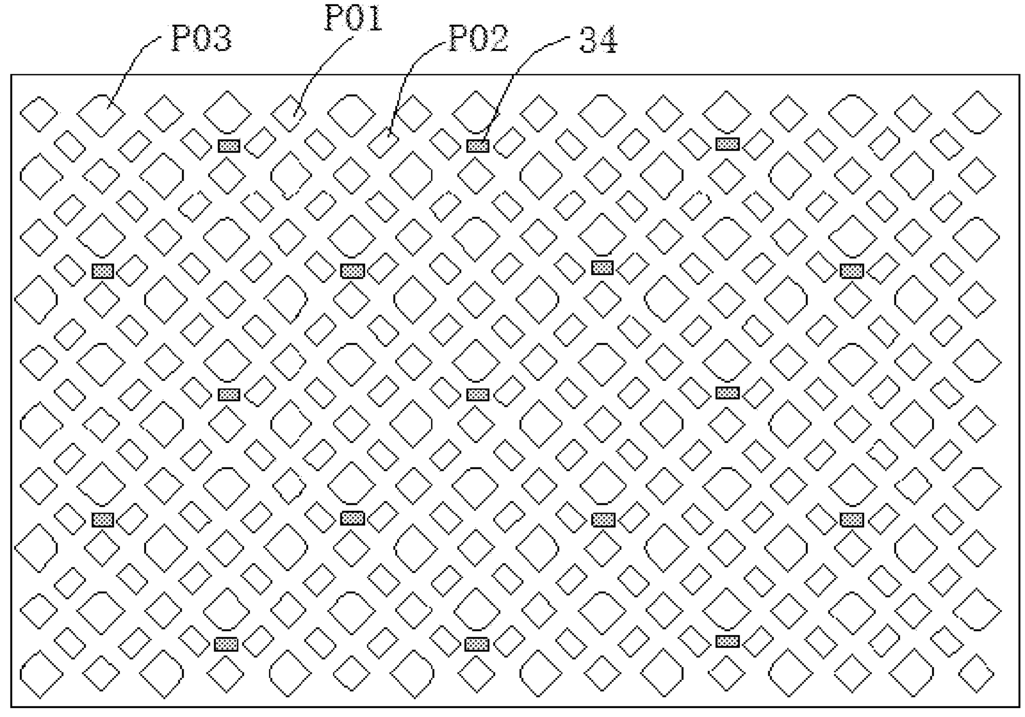
FIG. 11 is another schematic diagram illustrating a local distribution of a partial structure of a display substrate according to an embodiment of the present disclosure.

As another mode of the embodiment of the present disclosure, referring to FIGS. 10 and 11, at least a third sub-pixel P03 may have an "asymmetrical" shape with respect to an axis parallel to the first direction, the third sub-pixel P03 "misses" a part on a side (a first portion, such as a lower side in FIG. 10) with respect to the other side (a second portion, an upper side in FIG. 10), so that a size of the first portion of the third sub-pixel P03 in the second direction is "shorter". Thus, the first spacer region 91 may be provided between the side where the "shorter" first portion of the third sub-pixel P03 is located and the first sub-pixel P01. That is, the third sub-pixel P03 may not necessarily be "moved", but satisfy the requirement for the width of the first spacer region 91 by changing the shape of the third sub-pixel P03 (alternatively, it is also possible that the third sub-pixel P03 "misses" the part on the side and is "moved").

Further, referring to FIG. 11, when the post spacers 34 are provided only at some positions, the first portions of the different third sub-pixels P03 are differently oriented to form positions where the post spacers 34 are provided.

In some embodiments, an area of the second sub-pixel P02 is smaller than that of the first sub-pixel P01; and The area of the second sub-pixel P02 is smaller than that of the third sub-pixel P03.

As one mode of the embodiment of the present disclosure, referring to FIGS. 8 and 9, the area of the second sub-pixel P02 (e.g., the green sub-pixel) may be the smallest. For example, the area of the third sub-pixel P03 (e.g., the blue sub-pixel) is the largest, the area of the second sub-pixel P02 (e.g., the green sub-pixel) is the smallest, and the area of the first sub-pixel P01 (e.g., the red sub-pixel) is the middle.

In some embodiments, the sub-pixels P include the first sub-pixels P01, the second sub-pixels P02, the third sub-pixels P03;

First sub-pixel pairs P91 and the third sub-pixels P03 are alternately arranged along the first direction to form a fifth pixel group A05; each first sub-pixel pair P91 includes one first sub-pixel P01 and one second sub-pixel P02 arranged in the second direction; the second direction intersects the first direction;

The first and second sub-pixels P01 and P02 are alternately arranged along the second direction to form a sixth pixel group A06;

The third sub-pixels P03 are arranged along the second direction to form a seventh pixel group A07; and The sixth pixel group A06 and the seventh pixel group A07 are alternately arranged along the first direction; a plurality of the fifth pixel groups A05 are arranged along the second direction.

Figure 12:
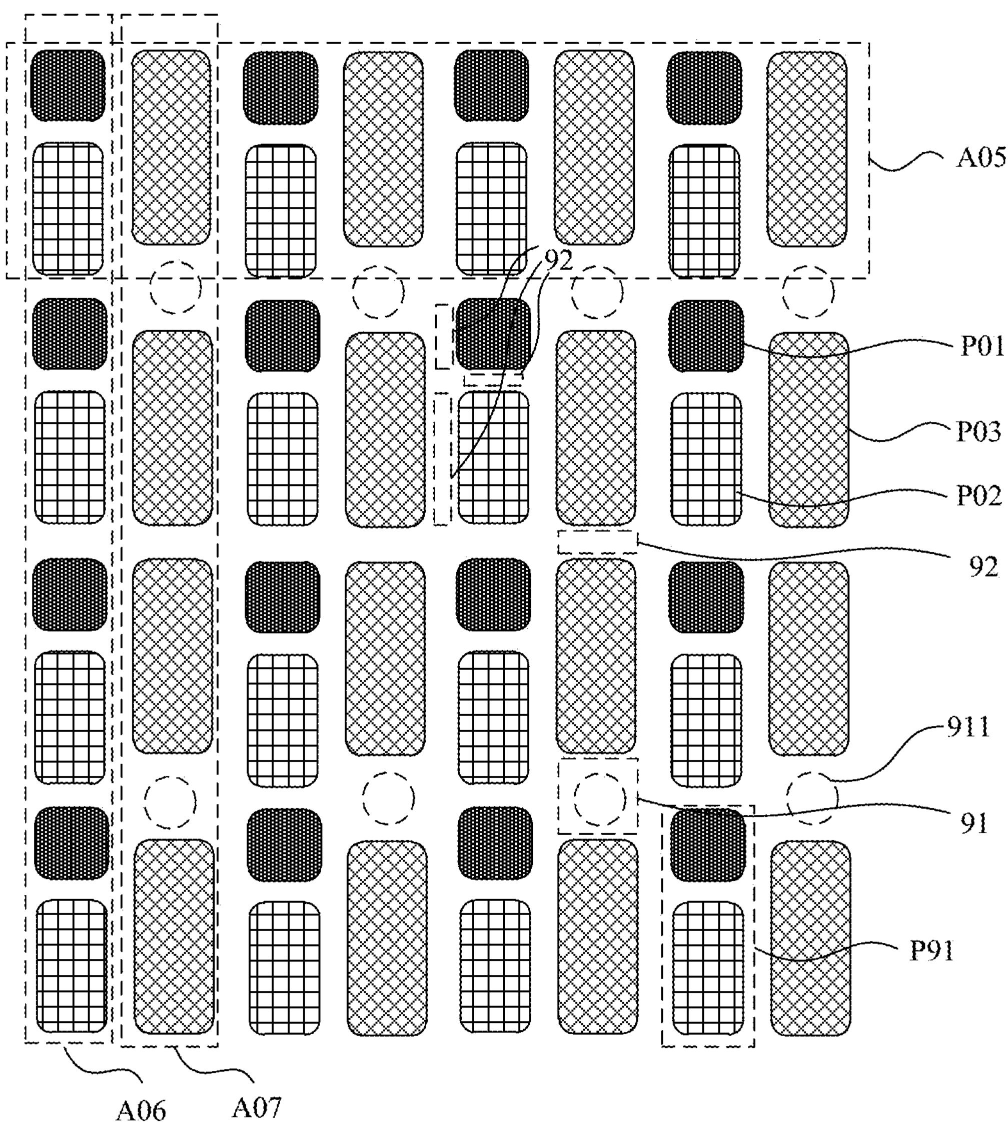
FIG. 12 is another schematic diagram illustrating a local distribution of a partial structure of a display substrate according to an embodiment of the present disclosure.
Figure 13:
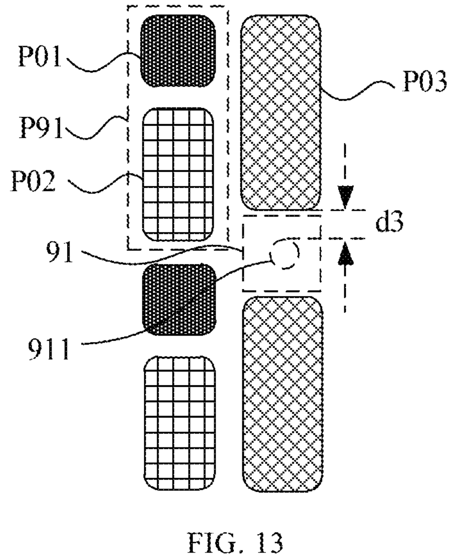
FIG. 13 is a schematic enlarged view of a partial structure in FIG. 12.

As another mode of the embodiment of the present disclosure, referring to FIGS. 12 and 13, one first sub-pixel P01 and one second sub-pixel P02 adjacent to each other in the column direction may form one "first sub-pixel pair P91"; and the first sub-pixel pairs P91 and the third sub-pixels P03 are alternately arranged to form a plurality of rows of fifth pixel groups A05; the first sub-pixel pairs P91 are further arranged in a plurality of columns of sixth pixel groups A06, the third sub-pixels P03 are arranged in a plurality of columns of seventh pixel groups A07, and the seventh pixel groups A07 and the sixth pixel groups A06 are alternately arranged in the row direction.

In some embodiments, in the spacer regions each between the adjacent third sub-pixels P03 in the seventh pixel group A07, at least some spacer regions are the first spacer regions 91;

The spacer regions each between the first sub-pixel P01 and the third sub-pixel P03 adjacent to each other in the fifth pixel group A05, and the spacer regions each between the second sub-pixel P02 and the third sub-pixel P03 adjacent to each other in the fifth pixel group A05 are the second spacer regions 92; and The spacer regions each between the first sub-pixel P01 and the second sub-pixel P02 adjacent to each other in the fifth pixel group A05 are the second spacer regions 92.

As another mode of the embodiment of the present disclosure, referring to FIGS. 12 and 13, each first spacer region 91 is located between the adjacent third sub-pixels P03 in the column direction; the spacer regions each between the third sub-pixel P03 and the first sub-pixel P01 adjacent to each other in the row direction, the spacer regions each between the third sub-pixel P03 and the second sub-pixel P02 adjacent to each other in the row direction, and the spacer regions each between the first sub-pixel P01 and the second sub-pixel P02 adjacent to each other in the column direction are the second spacer regions 92.

That is, the interval between at least some third sub-pixels P03 in the same column may be "enlarged", to increase a distance between the post spacer position 911 and the sub-pixel P (e.g., increase d3 as shown in FIG. 13 from 5 μm to 10 μm).

In some embodiments, the spacer regions between the adjacent third sub-pixels P03 in at least a seventh pixel group A07 are alternately arranged along the second direction as the first spacer regions 91 and the second spacer regions 92.

Referring to FIGS. 12 and 13, the spacer regions in at least a seventh pixel group A07 may alternately be the first spacer regions 91 and the second spacer regions 92, so that the post spacer positions 911 are distributed more uniformly.

In some embodiments, the area of the third sub-pixel P03 is greater than that of the first sub-pixel P01; and The area of the third sub-pixel P03 is greater than that of the second sub-pixel P02.

As one mode of the embodiment of the present disclosure, referring to FIGS. 12 and 13, the area of the third sub-pixel P03 (e.g., the blue sub-pixel) may be the largest. For example, the area of the third sub-pixel P03 (e.g., the blue sub-pixel) is the largest, the area of the second sub-pixel P02 (e.g., the green sub-pixel) is the middle, and the area of the first sub-pixel P01 (e.g., the red sub-pixel) is the smallest.

The first sub-pixel P01, the second sub-pixel P02 and the third sub-pixel P03 may also have various shapes. For example, referring to FIGS. 12 and 13, the shapes of the first sub-pixel P01, the second sub-pixel P02 and the third sub-pixel P02 are all rectangles or rounded rectangles, and two sides of the rectangle (or the rounded rectangle) are parallel to the row direction and the column direction, respectively.

In some embodiments, at least a third sub-pixel P03 is divided into asymmetric first and second portions by a line passing through a geometric center of the third sub-pixel P03 and parallel to the first direction; and a maximum dimension of the first portion is smaller than that of the second portion along the second direction; and In the first spacer regions 91 each between the third sub-pixels P03 adjacent to each other in the second direction, at least a first spacer region 91 is a spacer region between the first portions of the third sub-pixels P03.

Figure 14:
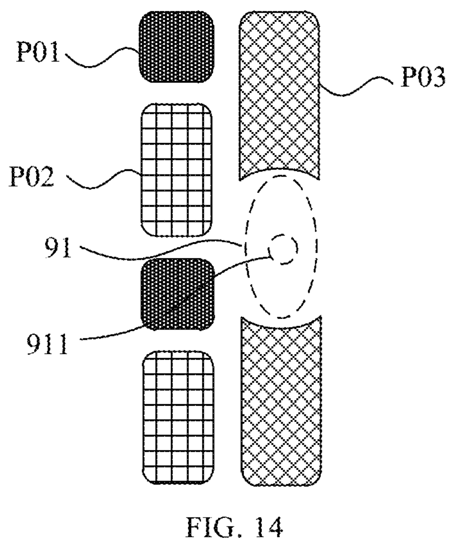
FIG. 14 is another schematic diagram illustrating a local distribution of a partial structure of a display substrate according to an embodiment of the present disclosure.

As another mode of the embodiment of the present disclosure, referring to FIG. 14, at least a third sub-pixel P03 may have an "asymmetrical" shape with respect to an axis parallel to the first direction, the third sub-pixel P03 "misses" a part on a side with respect to the other side (a lower side of the upper third sub-pixel P03, and an upper side of the lower third sub-pixel P03 in FIG. 14), so that a size of the first portion of the third sub-pixel P03 in the second direction is "shorter". Thus, the first spacer region 91 may be provided between the "shorter" first portions of two third sub-pixels P03, to satisfy the requirement for the width of the first spacer region 91.

It should be understood that the specific shape of the sub-pixel P is set in the scheme where the third sub-pixel P03 "misses" the part on a side and the first spacer region 91 is provided on the "missed" side of the third sub-pixel P03, so that the specific shape of the sub-pixel P is unnecessarily related to the positions of the sub-pixels P themselves and the positions of the spacer regions. Therefore, the above scheme is "compatible" with other various schemes for the arrangement of the sub-pixels P and the spacer regions.

It should be understood that except that the third sub-pixel P03 may "miss" the part on the side, the other sub-pixels P "miss" the parts at positions corresponding to the first spacer regions 91, to satisfy the requirement for the width of the first spacer region 91.

In some embodiments, the sub-pixels P include the first sub-pixels P01, the second sub-pixels P02, the third sub-pixels P03;

Second sub-pixel pairs P92, the first sub-pixels P01 and the third sub-pixels P03 are alternately arranged along the first direction to form an eighth pixel group A08; each second sub-pixel pair P92 includes two second sub-pixels P02 arranged along the second direction; the second direction intersects the first direction;

A plurality of the eighth pixel groups A08 are arranged along the second direction; and One second sub-pixel pair P92 of one of the two adjacent eighth pixel groups A08 is located between one first sub-pixel P01 and one third sub-pixel P03 of the other one of the eighth pixel groups A08 along the first direction.

Figure 15:
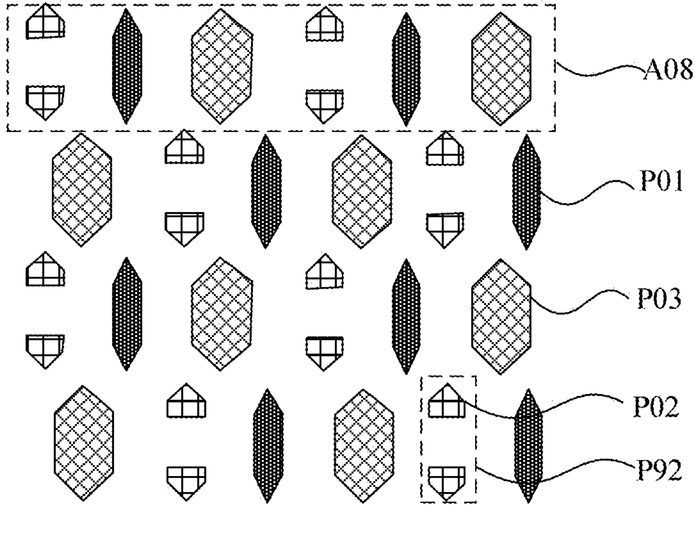
FIG. 15 is yet another schematic diagram illustrating a local distribution of a partial structure of a display substrate according to an embodiment of the present disclosure.
Figure 16:
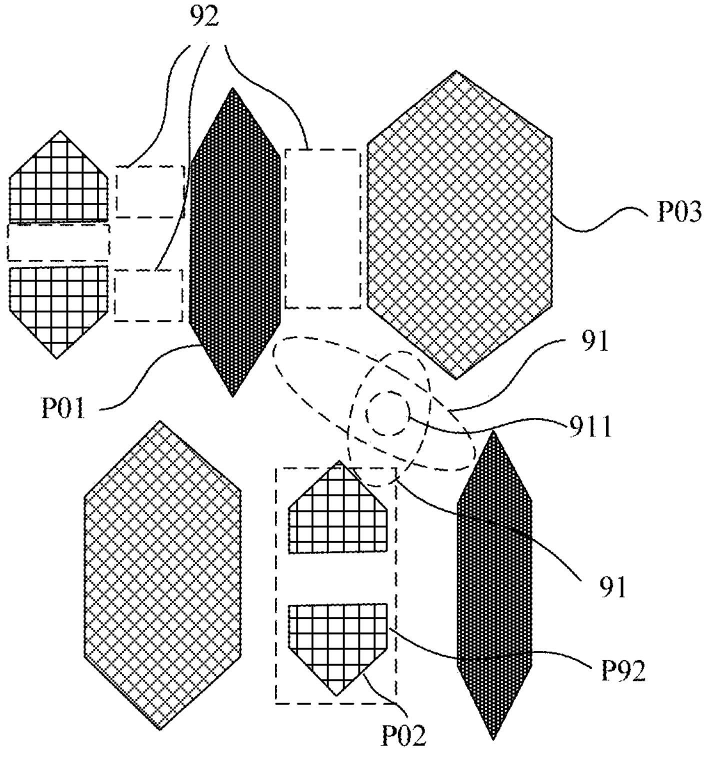
FIG. 16 is a schematic enlarged view of a partial structure in FIG. 15.
Figures 17, 18:
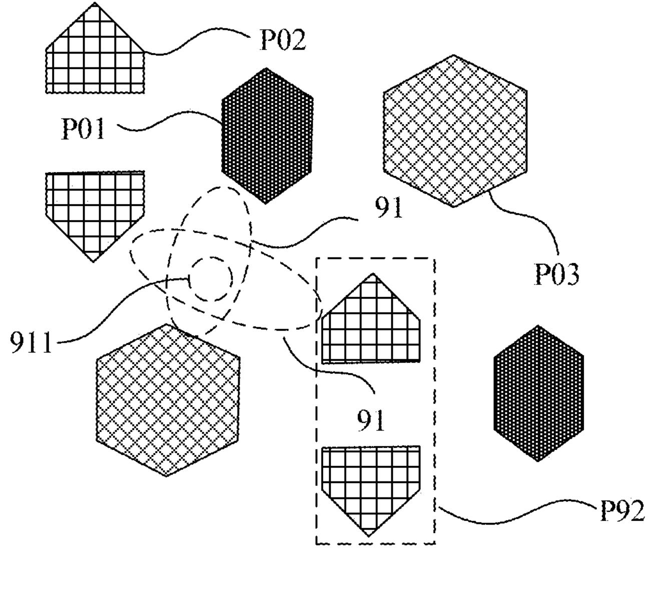
FIG. 17 is another schematic enlarged view of a partial structure in FIG. 15.
FIG. 18 is a block diagram illustrating a display apparatus according to an embodiment of the present disclosure.

As one mode of the embodiment of the present disclosure, referring to FIGS. 15, 16, and 17, two second sub-pixels P02 adjacent to each other in the column direction may form one second sub-pixel pair P92; and the second sub-pixel pairs P92, the first sub-pixels P01, and the third sub-pixels P03 may be alternately arranged to form a plurality of rows of eighth pixel groups A08, and the adjacent rows of the eighth pixel groups A08 are staggered by "one and a half columns of sub-pixels".

In some embodiments, at least some spacer regions each between the two adjacent eighth pixel groups A08 and between the first sub-pixel P01 and the third sub-pixel P03 adjacent to each other are the first spacer regions 91.

As one mode of the embodiment of the present disclosure, referring to FIG. 16, it may be that a distance between the two second sub-pixels P02 in the second sub-pixel pair P92 is "reduced", so that a distance between the second sub-pixel P02 and the third sub-pixel P03 diagonally adjacent to each other in the adjacent eighth pixel groups A08 (the adjacent rows of the eighth pixel groups A08) is increased, and thus, the post spacer position 911 (the first spacer region 91) may be provided between the second sub-pixel P02 and the third sub-pixel P03. Alternatively, the post spacer position 911 is also located between two adjacent first sub-pixels P01 diagonally adjacent to each other in the adjacent eighth pixel groups A08.

In some embodiments, at least some spacer regions among the two adjacent eighth pixel groups A08 and the first sub-pixel P01 and the second sub-pixel P02 adjacent to each other are the first spacer regions 91.

As another mode of the embodiment of the present disclosure, referring to FIG. 17, the first sub-pixel P01 and the third sub-pixel P03 is "compressed" in the column direction, so that a distance between the first sub-pixel P01 and the third sub-pixel P03 diagonally adjacent to each other in the adjacent eighth pixel groups A08 (the adjacent rows of the eighth pixel groups A08) is increased, and thus, the post spacer position 911 (the first spacer region 91) may be provided between the first sub-pixel P01 and the third sub-pixel P03. Alternatively, the post spacer position 911 is also located between two adjacent second sub-pixels P02 diagonally adjacent to each other in the adjacent eighth pixel groups A08.

In this way, the first sub-pixels P01 located at upper and lower sides, respectively, of the adjacent eighth pixel groups A08 are substantially located in a "same row", so that a better display effect can be achieved.

In some embodiments, two second sub-pixels P02 of the second sub-pixel pair P92 are symmetrically distributed with respect to a line parallel to the first direction.

Referring to FIGS. 15, 16 and 17, the two second sub-pixels P02 of each second sub-pixel pair P92 may be vertically symmetrical, to improve the uniformity of the distribution of the second sub-pixel pair P92.

The first sub-pixel P01, the second sub-pixel P02 and the third sub-pixel P03 may have various shapes. For example, referring to FIGS. 15, 16, and 17, the first and third sub-pixels P01 and P02 may each have a hexagon shape, and each hexagon may include two parts that are vertically symmetrical; each second sub-pixel P02 may have a pentagon shape, that is, two second sub-pixels P02 in each second sub-pixel pair P92 are joined together to form a hexagon.

In some embodiments, the area of the second sub-pixel P02 is smaller than that of the first sub-pixel P01; and The area of the second sub-pixel P02 is smaller than that of the third sub-pixel P03.

As one mode of the embodiment of the present disclosure, referring to FIGS. 15, 16, and 17, the area of the second sub-pixel P02 (e.g., the green sub-pixel) may be the smallest. For example, the area of the third sub-pixel P03 (e.g., the blue sub-pixel) is the largest, the area of the second sub-pixel P02 (e.g., the green sub-pixel) is the smallest, and the area of the first sub-pixel P01 (e.g., the red sub-pixel) is the middle.

In some embodiments, the resolution of the display substrate is less than or equal to 1000 PPI.

The display substrate of the embodiment of the present disclosure is suitable for the low resolution. For example, the resolution does not exceed 1000 PPI (pixels per inch), further does not exceed 800 PPI, further does not exceed 600 PPI, or the like. When the resolution of the display substrate is too high, a theoretically possible interval between the sub-pixels P is too small, and it is difficult to achieve the above interval condition.

In a second aspect, referring to FIG. 18, an embodiment of the present disclosure further provides a display apparatus including the display substrate in any one of the above embodiments.

The display substrate may be assembled with other structures (e.g., an opposite substrate, a driving device, a power module, a housing, and the like) to form a display apparatus which is a separate product having a display function.

Specifically, the display apparatus may be any product or component having a display function, such as an organic light emitting diode (OLED) display panel, an electronic paper, a mobile phone, a tablet computer, a television, a display, a notebook computer, a digital photo frame, and a navigator.

It should be understood that, the above embodiments are merely exemplary embodiments adopted to explain the principles of the present disclosure, and the present disclosure is not limited thereto. It will be apparent to one of ordinary skill in the art that, various changes and modifications may be made therein without departing from the spirit and scope of the present disclosure, and such changes and modifications also fall within the scope of the present disclosure.

What is claimed is:

1. A display substrate, comprising a base substrate, and a plurality of sub-pixels in an array at intervals on the base substrate; wherein two adjacent sub-pixels of the plurality of sub-pixels are provided with a spacer region therebetween; the spacer region comprises a first spacer region having a functional position, and a second spacer region having no functional position;

at least some functional positions are provided with functional parts; and a width of the first spacer region between two adjacent sub-pixels arranged along a first direction or a second direction is greater than a width of the second spacer region between two adjacent sub-pixels arranged along the first direction or the second direction; wherein a width of the spacer region is equal to a shortest distance between boundaries of the two adjacent sub-pixels corresponding to the spacer region, wherein the plurality of sub-pixels comprise first sub-pixels, second sub-pixels, and third sub-pixels;

the first sub-pixels and the third sub-pixels are alternately arranged along the first direction to form first pixel groups, and are alternately arranged along the second direction to form third pixel groups; the second direction intersects the first direction;

the second sub-pixels are arranged along the first direction to form second pixel groups, and arranged along the second direction to form fourth pixel groups; and wherein the first pixel groups and the second pixel groups are alternately arranged along the second direction; the third pixel groups and the fourth pixel groups are alternately arranged along the first direction; and wherein at least some spacer regions, in the spacer regions between the first sub-pixels and the third sub-pixels adjacent to each other in the third pixel groups, are the first spacer regions; and the spacer regions between the first sub-pixels and the third sub-pixels adjacent to each other in the first pixel groups are the second spacer regions.

2. The display substrate of claim 1, wherein the width of the first spacer region is greater than or equal to 20 μm;

wherein a distance between a boundary of each functional part and a boundary of a corresponding sub-pixel closest to the functional part is greater than or equal to 3 μm; and wherein the width of the second spacer region is less than or equal to 19 μm.

3. The display substrate of claim 1, wherein a shortest connecting line between boundaries of two sub-pixels corresponding to each of at least one first spacer region passes through the functional part in the first spacer region; and wherein in a cross-section passing through the shortest connecting line and perpendicular to the base substrate, a distance between the boundaries of the two sub-pixels corresponding to the first spacer region is greater than or equal to 20 μm, and a distance between the functional part in the first spacer region and each of the two sub-pixels is greater than or equal to 3 μm.

4. The display substrate of claim 1, wherein a connecting line between geometric centers of two sub-pixels corresponding to each of at least one first spacer region passes through the functional part in the first spacer region; and the connecting line between the geometric centers of the two sub-pixels corresponding to the first spacer region passes through a geometric center of the functional part in the first spacer region.

5. The display substrate of claim 1, wherein at least one first spacer region extends in a third direction;

at least one first spacer region extends in a fourth direction, which intersects the third direction; and the at least one first spacer region extending in the third direction and the at least one first spacer region extending in the fourth direction have an overlapping region therebetween, and at least one functional part at least partially overlaps the overlapping region.

6. The display substrate of claim 1, wherein a distance between two adjacent functional parts is between 100 μm and 300 μm; and the number of the functional positions provided with the functional parts is at least 15% of the number of all the functional parts.

7. The display substrate of claim 1, further comprising a pixel definition layer;

wherein the pixel definition layer comprises pixel definition layer openings, and pixel definition parts between the pixel definition layer openings;

the pixel definition layer openings define light emitting regions of the plurality of sub-pixels; and the functional parts are on a side of the pixel definition parts away from the base substrate; and wherein the functional parts and the pixel definition parts have a one-piece structure.

8. The display substrate of claim 1, wherein in the sub-pixels adjacent to at least some functional parts, at least one sub-pixel has a geometric center offset from a straight line extending along the first direction, and at least two sub-pixels in the same row as the at least one sub-pixel in the first direction have geometric centers on the straight line;

and/or in the sub-pixels adjacent to the at least some functional parts, at least one sub-pixel has a geometric center offset from a straight line extending along the second direction, and at least two sub-pixels in the same row as the at least one sub-pixel in the second direction have geometric centers on the straight line; the second direction intersects the first direction.

9. The display substrate of claim 1, wherein the spacer regions between the first sub-pixels and the third sub-pixels adjacent to each other in the third pixel groups are alternately arranged along the second direction as the first spacer regions and the second spacer regions; and in two adjacent third pixel groups, the first spacer region in one of two adjacent third pixel groups and the second spacer region in the other one of the two adjacent third pixel groups are between two rows of sub-pixels in the first direction.

10. The display substrate of claim 9, wherein lines sequentially connecting geometric centers of two first sub-pixels and two third sub-pixels in an array form a virtual trapezoid; and a spacer region between the first sub-pixel and the third sub-pixel corresponding to a bottom side of the virtual trapezoid is the first spacer region, and a spacer region between the first sub-pixel and the third sub-pixel corresponding to a top side of the virtual trapezoid is the second spacer region.

11. The display substrate of claim 10, wherein the bottom side of the virtual trapezoid is parallel to the second direction; and/or wherein the virtual trapezoid is a virtual isosceles trapezoid.

12. The display substrate of claim 1, wherein in each of at least one first spacer region between the first sub-pixels and the third sub-pixels adjacent to each other, a geometric center of the functional part is on a connecting line between a geometric center of the first sub-pixel and a geometric center of the third sub-pixel corresponding to the first spacer region.

13. The display substrate of claim 1, wherein in each of at least one first spacer region between the first sub-pixels and the third sub-pixels adjacent to each other, along the second direction, a distance between a geometric center of the functional part and a geometric center of the first sub-pixel corresponding to the first spacer region is smaller than a distance between the geometric center of the functional position and a geometric center of the third sub-pixel corresponding to the first spacer region; and wherein in each of at least one first spacer region between the first sub-pixels and the third sub-pixels adjacent to each other, along the second direction, the geometric center of the functional part is on a side of a reference line corresponding to the functional part close to the first sub-pixel corresponding to the first spacer region; wherein the reference line of the functional position is a connecting line between geometric centers of the two second sub-pixels on two sides of the functional position in the first direction.

14. The display substrate of claim 1, wherein at least one third sub-pixel is divided into a first portion and a second portion, which are asymmetric, by a line passing through a geometric center of the third sub-pixel and parallel to the first direction; and a maximum dimension of the first portion is smaller than that of the second portion along the second direction; and in the first spacer regions between the first sub-pixels and the third sub-pixels adjacent to each other in the second direction, at least one first spacer region each is a spacer region between the first portion of the third sub-pixel and the first sub-pixel adjacent to the third sub-pixel.

15. A display substrate, comprising a base substrate, and a plurality of sub-pixels in an array at intervals on the base substrate; wherein two adjacent sub-pixels of the plurality of sub-pixels are provided with a spacer region therebetween; the spacer region comprises a first spacer region having a functional position, and a second spacer region having no functional position;

at least some functional positions are provided with functional parts; and a width of the first spacer region between two adjacent sub-pixels arranged along a first direction or a second direction is greater than a width of the second spacer region between two adjacent sub-pixels arranged along the first direction or the second direction; wherein a width of the spacer region is equal to a shortest distance between boundaries of the two adjacent sub-pixels corresponding to the spacer region, wherein the plurality of sub-pixels comprise first sub-pixels, second sub-pixels, third sub-pixels;

first sub-pixel pairs and the third sub-pixels are alternately arranged along the first direction to form a fifth pixel group; each first sub-pixel pair comprises one first sub-pixel and one second sub-pixel in the second direction; the second direction intersects the first direction;

the first sub-pixels and the second sub-pixels are alternately arranged along the second direction to form a sixth pixel group;

the third sub-pixels are arranged along the second direction to form a seventh pixel group; and wherein a plurality of the sixth pixel groups and a plurality of the seventh pixel groups are alternately arranged along the first direction; a plurality of the fifth pixel groups are arranged along the second direction.

16. The display substrate of claim 15, wherein in the spacer regions between two adjacent third sub-pixels in the seventh pixel group, at least some spacer regions are the first spacer regions;

the spacer regions between the first sub-pixels and the third sub-pixels adjacent to each other in the fifth pixel group, and the spacer regions between the second sub-pixels and the third sub-pixels adjacent to each other in the fifth pixel group are the second spacer regions; and the spacer regions between the first sub-pixels and the second sub-pixels adjacent to each other in the fifth pixel group are the second spacer regions; and wherein the spacer regions between two adjacent third sub-pixels in at least one seventh pixel group are alternately arranged along the second direction as the first spacer regions and the second spacer regions.

17. The display substrate of claim 15, wherein each of at least one third sub-pixel is divided into a first portion and a second portion, which are asymmetric, by a line passing through a geometric center of the third sub-pixel and parallel to the first direction; and a maximum dimension of the first portion is smaller than that of the second portion along the second direction; and in the first spacer regions between the third sub-pixels adjacent to each other in the second direction, at least one first spacer region each is a spacer region between the first portions of the third sub-pixels.

18. A display substrate, comprising a base substrate, and a plurality of sub-pixels in an array at intervals on the base substrate; wherein two adjacent sub-pixels of the plurality of sub-pixels are provided with a spacer region therebetween; the spacer region comprises a first spacer region having a functional position, and a second spacer region having no functional position;

at least some functional positions are provided with functional parts; and a width of the first spacer region between two adjacent sub-pixels arranged along a first direction or a second direction is greater than a width of the second spacer region between two adjacent sub-pixels arranged along the first direction or the second direction; wherein a width of the spacer region is equal to a shortest distance between boundaries of the two adjacent sub-pixels corresponding to the spacer region, wherein the plurality of sub-pixels comprise first sub-pixels, second sub-pixels, third sub-pixels;

second sub-pixel pairs, the first sub-pixels and the third sub-pixels are alternately arranged along the first direction to form an eighth pixel group; each second sub-pixel pair comprises two second sub-pixels along the second direction; the second direction intersects the first direction;

a plurality of the eighth pixel groups are arranged along the second direction; and one second sub-pixel pair of one of two adjacent eighth pixel groups is between one first sub-pixel and one third sub-pixel of the other one of the two adjacent eighth pixel groups along the first direction;

wherein at least some spacer regions between the two adjacent eighth pixel groups and between the first sub-pixel and the third or the second sub-pixel adjacent to each other are the first spacer regions or two second sub-pixels in each second sub-pixel pair are symmetrically distributed with respect to a line parallel to the first direction.

19. A display apparatus, comprising the display substrate of claim 1.

* * * * *